(12) United States Patent
Mulder et al.

(10) Patent No.: US 12,218,677 B2
(45) Date of Patent: Feb. 4, 2025

(54) CIRCUIT AND METHOD FOR CALIBRATION OF DIGITAL-TO-ANALOG CONVERTER

(71) Applicant: AVAGO TECHNOLOGIES INTERNATIONAL SALES PTE. LIMITED, Singapore (SG)

(72) Inventors: Jan Mulder, Houten (NL); Frank Van der Goes, Zeist (NL); Mohammadreza Mehrpoo, Eindhoven (NL); Sijia Wang, Utrecht (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 244 days.

(21) Appl. No.: 17/889,877

(22) Filed: Aug. 17, 2022

(65) Prior Publication Data
US 2024/0063805 A1 Feb. 22, 2024

(51) Int. Cl.
*H03M 1/10* (2006.01)
*H03M 1/66* (2006.01)

(52) U.S. Cl.
CPC ............ *H03M 1/1014* (2013.01); *H03M 1/10* (2013.01); *H03M 1/1033* (2013.01); *H03M 1/66* (2013.01)

(58) Field of Classification Search
CPC ........ H03M 1/1014; H03M 1/66; H03M 1/10; H03M 1/1033
See application file for complete search history.

(56) References Cited

U.S. PATENT DOCUMENTS 6,407,688 B1 * 6/2002 Greig .................. H03M 1/0604
323/315

OTHER PUBLICATIONS

Olieman, et al., "An Interleaved Full Nyquist High-Speed DAC Technique", IEEE Journal of Solid-State Circuits, vol. 50, No. 3, Mar. 2015, pp. 704-713.
Tang, et al, "Predictive Timing Error Calibration Technique for RF Current-Steering DACs," IEEE 2008, pp. 228-231.
Tang, et al., "DDL-based Calibration Techniques for Timing Errors in Current-Steering DACs", IEEE 2006, pp. 101-104.
Van Del Vel, et al. "A 240mW 16b 3.2GS/s DAC in 65nm CMOS with <-80dBc IM3 up to 600MHz", ISSCC 2014, Session 11/DATA Converter Techniques/11.7, pp. 206-208.

* cited by examiner

*Primary Examiner* — Joseph J Lauture
(74) *Attorney, Agent, or Firm* — Foley & Lardner LLP

(57) ABSTRACT

Described herein are related to a device including a digital-to-analog converter (DAC) configured to convert a digital signal into an analog signal. In one aspect, the device includes a first circuit configured to generate a first signal. In one aspect, the device includes a second circuit coupled to the first circuit. The second circuit may be configured to generate a second signal, based on the first signal. The second signal may have a first edge according to the first signal. In one aspect, the device includes a third circuit coupled to the second circuit. The third circuit may be configured to generate a third signal having a second edge, in response to the first edge of the second signal. In one aspect, an amplitude of the third signal may correspond to one bit.

20 Claims, 10 Drawing Sheets

CIRCUIT AND METHOD FOR CALIBRATION OF DIGITAL-TO-ANALOG CONVERTER

FIELD OF THE DISCLOSURE

This disclosure generally relates to systems and methods for a digital-to-analog conversion, and more particularly to calibration for a digital-to-analog conversion.

BACKGROUND

A digital to analog converter is a circuit that can convert a first signal in a digital representation into a second signal in an analog representation. A signal can be one or more voltages, one or more currents, or any combination of them. A signal in an analog representation (or an analog signal) may indicate a value of data from a continuous range of values, where a signal in a digital representation (or a digital signal) may indicate a value of data from a finite set of values. An analog signal may provide a more accurate representation of data (e.g., audio data, image data, video data, or any data) than a digital signal, because a digital signal is obtained through quantization that involves truncating certain digits of the value. Meanwhile, an analog signal may be more susceptible to noise than a digital signal.

SUMMARY

Various embodiments disclosed herein are related to a device. In some embodiments, the device includes a first circuit configured to generate a first signal. In some embodiments, the device includes a second circuit coupled to the first circuit. In some embodiments, the second circuit is configured to generate a second signal, based on the first signal. The second signal may have a first edge according to the first signal. In some embodiments, the device includes a third circuit coupled to the second circuit. In some embodiments, the third circuit is configured to generate a third signal having a second edge, in response to the first edge of the second signal. An amplitude of the third signal may correspond to one bit.

In some embodiments, the second circuit includes a fourth circuit configured to provide a first drive strength of the second circuit, according to the first signal. In some embodiments, the second circuit is configured to generate the first edge of the second signal according to the first drive strength.

In some embodiments, the first circuit is configured to generate a fourth signal. In some embodiments, the second circuit includes a fifth circuit configured to provide a second drive strength of the second circuit, according to the fourth signal. In some embodiments, the second circuit is configured to generate a third edge of the second signal according to the second drive strength. In some embodiments, the third edge of the second signal is subsequent to the first edge of the second signal. In some embodiments, the third circuit is configured to generate a fourth edge of the third signal, in response to the third edge of the second signal. In some embodiments, the fourth edge is subsequent to the second edge of the third signal.

In some embodiments, the fourth circuit includes a first transistor configured to provide a second drive strength. In some embodiments, the fourth circuit includes a second transistor configured to provide a third drive strength. In some embodiments, the fourth circuit is configured to provide the first drive strength, based on the second drive strength and the third drive strength.

In some embodiments, the fourth circuit includes a third transistor coupled to the first transistor in series. The third transistor may be configured to enable or disable the first transistor, according to the one bit. In some embodiments, the fourth circuit includes a fourth transistor coupled to the second transistor in series. The fourth transistor may be configured to enable or disable the second transistor, according to the one bit.

In some embodiments, the first signal includes a first voltage applied to a first gate electrode of the first transistor. The first voltage may correspond to the second drive strength. In some embodiments, the first signal includes a second voltage applied to a second gate electrode of the second transistor. The second voltage may correspond to the third drive strength.

In some embodiments, the first circuit includes a first multiplexer configured to select, from a first set of voltages, a third voltage. In some embodiments, the first circuit includes a second multiplexer configured to select, from a second set of voltages, a fourth voltage. In some embodiments, the first circuit includes a third multiplexer configured to select one of the third voltage or the fourth voltage, as the first voltage. In some embodiments, the first circuit includes a fourth multiplexer configured to select one of the third voltage or the fourth voltage, as the second voltage.

In some embodiments, the first circuit is configured to provide a fourth signal to the third circuit. In some embodiments, the third circuit is configured to set the amplitude of the third signal, according to the fourth signal.

In some embodiments, the third circuit includes a fifth circuit configured to set a first current of the third circuit, according to the fourth signal. The amplitude of the third signal may be set according to the first current.

In some embodiments, the fifth circuit includes a third transistor configured to provide a second current. In some embodiments, the fifth circuit includes a fourth transistor configured to provide a third current. The fifth circuit may be configured to provide the first current, based on the second current and the third current.

In some embodiments, the fifth circuit includes a resistor coupled to the third transistor and the fourth transistor.

In some embodiments, the fourth signal includes a first voltage applied to a first gate electrode of the third transistor. The third transistor may be configured to provide the second current, according to the first voltage at the first gate electrode of the third transistor. In some embodiments, the fourth signal includes a second voltage applied to a second gate electrode of the fourth transistor. The fourth transistor may be configured to provide the third current, according to the second voltage at the second gate electrode of the fourth transistor.

In some embodiments, the first circuit includes a first multiplexer configured to select, from a first set of voltages, a third voltage. In some embodiments, the first circuit includes a second multiplexer configured to select, from a second set of voltages, a fourth voltage. In some embodiments, the first circuit includes a third multiplexer configured to select one of the third voltage or the fourth voltage, as the first voltage. In some embodiments, the first circuit includes a fourth multiplexer configured to select one of the third voltage or the fourth voltage, as the second voltage.

In some embodiments, the first signal includes a fifth voltage applied to a third gate electrode of the first transistor. The fifth voltage may correspond to the second drive strength. In some embodiments, the first signal includes a sixth voltage applied to a fourth gate electrode of the second transistor. The sixth voltage may correspond to the third drive strength. In some embodiments, the first circuit includes a fifth multiplexer configured to select, from a third set of voltages, a seventh voltage. In some embodiments, the first circuit includes a sixth multiplexer configured to select, from a fourth set of voltages, an eighth voltage. In some embodiments, the first circuit includes a seventh multiplexer configured to select one of the seventh voltage or the eighth voltage, as the fifth voltage. In some embodiments, the first circuit includes an eighth multiplexer configured to select one of the seventh voltage or the eighth voltage, as the sixth voltage.

Various embodiments disclosed herein are related to a device. In some embodiments, the device includes a first circuit configured to generate a first signal. In some embodiments, the device includes a second circuit coupled to the first circuit. In some embodiments, the second circuit is configured to generate a second signal, based on the first signal. The second signal may indicate a timing of a third signal. In some embodiments, the device includes a third circuit coupled to the second circuit. In some embodiments, the third circuit is configured to generate the third signal, according to the timing indicated by the second signal. An amplitude of the third signal may correspond to one bit.

In some embodiments, the second circuit includes a fourth circuit configured to provide a first drive strength of the second circuit, according to the first signal. In some embodiments, the second circuit is configured to generate a first edge of the second signal according to the first drive strength. The first edge may indicate the timing of a second edge of the third signal.

In some embodiments, the fourth circuit includes a first transistor configured to provide a second drive strength. In some embodiments, the fourth circuit includes a second transistor configured to provide a third drive strength. In some embodiments, the fourth circuit is configured to provide the first drive strength, according to the second drive strength and the third drive strength.

In some embodiments, the fourth circuit includes a third transistor coupled to the first transistor in series. In some embodiments, the third transistor is configured to enable or disable the first transistor, according to the one bit. In some embodiments, the fourth circuit includes a fourth transistor coupled to the second transistor in series. The fourth transistor may be configured to enable or disable the second transistor, according to the one bit.

Various embodiments disclosed herein are related to a device. In some embodiments, the device includes a first circuit configured to generate a first signal and a second signal. In some embodiments, the device includes a second circuit coupled to the first circuit. In some embodiments, the second circuit is configured to generate a third signal, based on the first signal. The third signal may have a first edge according to the first signal. In some embodiments, the device includes a third circuit coupled to the second circuit. In some embodiments, the third circuit is configured to generate a fourth signal having a second edge and an amplitude, according to the second signal and the third signal. The second edge of the fourth signal may correspond to the first edge of the third signal. The amplitude of the fourth signal may be set according to the second signal.

In some embodiments, the device is a transmitter. In some embodiments, the transmitter includes a digital-to-analog converter including the first circuit, the second circuit, and the third circuit.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
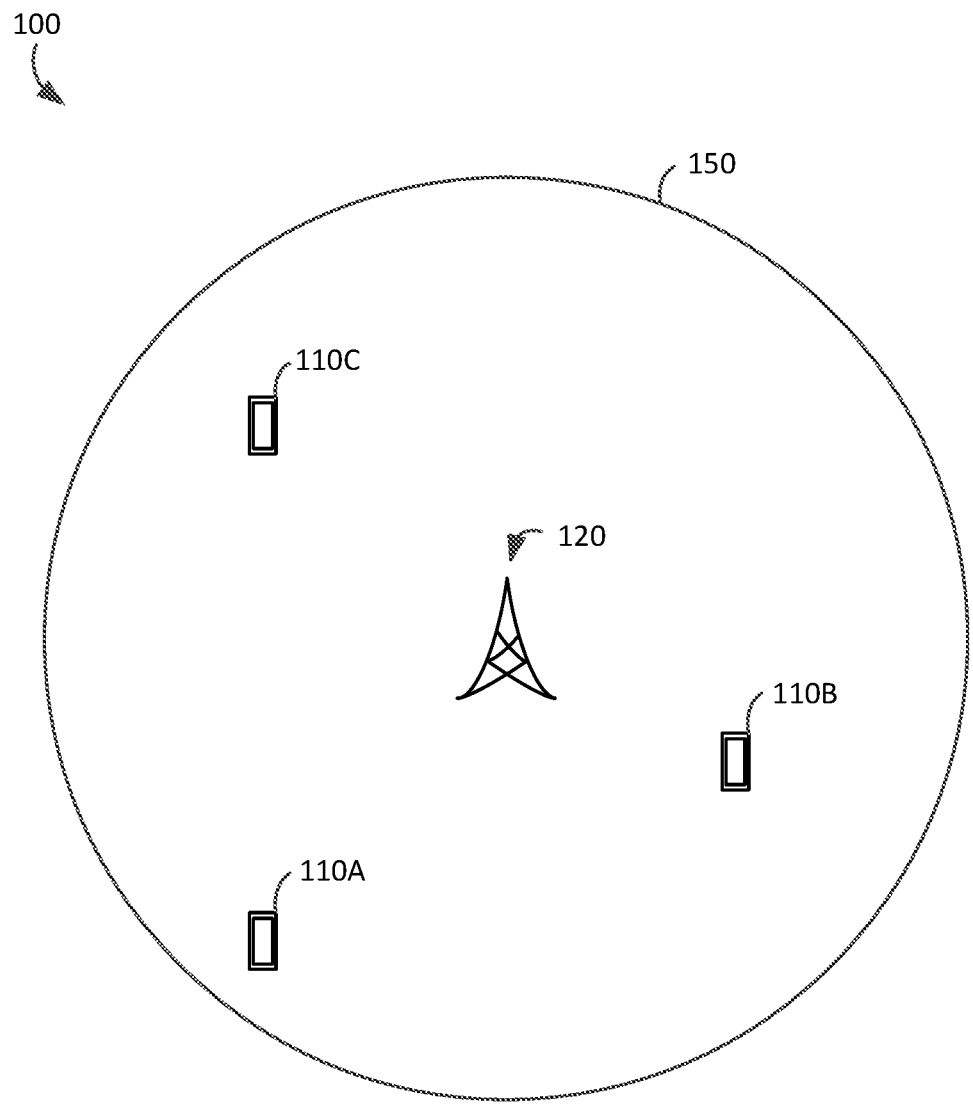
FIG. 1 is a block diagram of a communication system including a base station and client devices, in accordance with some embodiments.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s)

or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to calibration of a DAC including a plurality of DAC cells. A cell herein refers to a unit circuit having a set of components in a particular arrangement. Each DAC cell may be configured to receive a corresponding one bit of multiple bits of data, and to provide a current corresponding to the received one bit. In one aspect, currents from different DAC cells can be combined to represent the multiple bits of data. For example, an amplitude of the combined current in an analog representation may correspond to the multiple bits of data in a digital representation. In one aspect, calibration can be performed for each DAC cell to reduce errors in performing a digital-to-analog conversion.

In some embodiments, a DAC cell includes a bias control circuit, a driver circuit (or a latch), and a current steering circuit. The bias control circuit may be a circuit configured to provide one or more bias voltages for configuring the driver circuit and the current steering circuit. A bias voltage may be a voltage to set an amount of current flow or a drive strength (e.g., transconductance (gm)) of a transistor or a circuit. A drive strength may be an amount of change in a current provided, in response to a change in a voltage applied. The driver circuit may be a circuit configured to provide a second signal having a first edge, based on a first signal (e.g., bias voltages) from the bias control circuit. An edge of a signal may be a change in a state of the signal from one state to another state. A rising edge may be a change from a low state (e.g., 0V) to a high state (e.g., 1V), and a falling edge may be a change from a high state (e.g., 1V) to a low state (e.g., 0V). In one aspect, a falling edge occurring after a rising edge may be a subsequent edge to the rising edge, and another rising edge occurring after the falling edge may be a subsequent edge to the falling edge. The first edge of the second signal may be set or adjusted, according to the drive strength of the driver circuit. For example, the second signal may have a faster edge by increasing the drive strength of the driver circuit. In one aspect, the driver circuit includes an adjustable current source or an adjustable transconductance circuit that can set a drive strength, according to the first signal (e.g., bias voltages). In one aspect, the current steering circuit may be a circuit configured to generate or provide a current corresponding to one bit of data. The current steering circuit may be configured to generate a third signal having a second edge, in response to the first edge of the second signal.

Advantageously, each DAC cell can be individually calibrated to reduce timing errors in a digital-to-analog conversion. In one aspect, timing errors or differences in timing of generating currents by different DAC cells can cause errors in combining currents from different DAC cells, and may cause inaccuracy in generating an analog signal corresponding to a digital signal. Disclosed device and method herein may allow adjusting timing of generating the third signal for each DAC cell with high granularity, such that timing errors or differences in timing of generating currents by different DAC cells can be reduced. In one aspect, the first edge (e.g., rising edge) of the second signal is indicative of timing of generating the second edge (e.g., rising edge) of the third signal. For example, the DAC cell may generate the second edge of the third signal, when the first edge of the second signal occurs. Hence, by adjusting a drive strength of a driver circuit of the DAC cell, the first edge of the second signal can be adjusted, and consequently timing of generating the second edge of the third signal can be adjusted. In one aspect, the driver circuit includes an adjustable transconductance circuit that can adjust the drive strength with high granularity. For example, the adjustable transconductance circuit includes a set of transconductance circuits providing different currents or different drive strengths. The combined current or combined drive strength from the set of transconductance circuits may correspond to the drive strength of the second circuit. The first circuit may provide different bias voltages to the set of transconductance circuits, such that currents or drive strengths provided by the set of transconductance circuits can be individually configured or controlled. By configuring or controlling different transconductance circuits individually, drive strength of a driver circuit in a DAC can be set or adjusted with a high granularity. Moreover, different DAC cells can be calibrated to reduce timing errors in a digital-to-analog conversion.

In one aspect, each DAC cell can be individually calibrated to reduce amplitude errors in a digital-to-analog conversion. In one aspect, amplitude errors or differences in amplitudes of currents provided by different DAC cells can cause errors in an amplitude of the combined current from different DAC cells, and may cause inaccuracy in an analog signal generated based on the amplitude of the combined current. Disclosed device and method herein may allow adjusting an amplitude of the third signal for each DAC cell with high granularity, such that amplitude errors or differences in amplitudes of currents provided by different DAC cells can be reduced. In one aspect, the bias control circuit provides a fourth signal (e.g., bias voltages) to the current steering circuit. In one aspect, the current steering circuit includes an adjustable current source that can adjust a current corresponding to the one bit with high granularity. For example, the adjustable current source includes a set of current sources (or a set of transconductance circuits) providing different currents. An amplitude of the combined current from the set of current sources may represent or correspond to the one bit. The first circuit may provide different bias voltages to the set of current sources, such that currents provided by the set of current sources can be individually configured or controlled. By configuring or controlling different current sources individually, the amplitude of the current output by the current steering circuit can be set or adjusted with a high granularity. Moreover, different DAC cells can be calibrated to reduce amplitude errors in a digital-to-analog conversion.

In one aspect, the DAC is implemented for a wireless communication. For example, the DAC can be implemented in a transmitter for a radio frequency (RF) communication, such as a cellular communication (3G, 4G, 5G, 6G, etc.), Wi-Fi communication, Bluetooth communication etc. In some embodiments, the transmitter is a transmitter of a base station (e.g., eNode B (eNB), gNodeB (gNB), etc.) that provides a wireless communication. In one aspect, the DAC may operate at a high speed (e.g., over 5 Giga samples per second), and may convert a modulated signal at radio frequency in a digital representation into an analog signal in an analog representation. The DAC may provide the analog signal to a preamplifier or a power amplifier for transmission through an antenna, such that an analog upconverter or an analog mixer can be omitted. By omitting the analog upconverter or the analog mixer, the transmitter can reduce power consumption, improve linearity, provide design flexibility, and can be implemented in a small form factor. Moreover, modulation or upconversion of a signal in a baseband frequency (e.g., 100 MHz-1 GHz) to an RF frequency (e.g., 1-10 GHz) can be performed by a digital logic circuit that may be less susceptible to noise than an analog circuit, such that the transmitter can improve a signal quality. In some embodiments, the DAC is provided in an integrated circuit package (e.g., multichip module or single chip package). Although the DAC disclosed herein is provided for a transmitter for a wireless communication, the DAC can be implemented for different applications. For example, the DAC disclosed herein can be implemented for a wired communication, an optical communication, or any computing device that performs a high speed digital-to-analog conversion.

In some embodiments, one or more components can be embodied as one or more transistors. The transistors implemented may be N-type transistors or P-type transistors. An N-type transistor may be a transistor that utilizes electrons as majority carriers. A P-type transistor may be a transistor that utilizes holes as majority carriers. The transistors can be any suitable transistors including, but not limited to, metal oxide semiconductor field effect transistors (MOSFETs), bipolar junction transistors (BJTs), high voltage transistors, high frequency transistors, FinFETs, GaaFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode or a drain electrode can be referred to as a source/drain electrode herein. According to a voltage applied to a gate electrode of the transistor, current may flow between a source electrode and a drain electrode. In certain application, a transistor can be implemented as a switch. For example, if a voltage difference between a gate electrode and a source electrode of a transistor is larger than a threshold voltage of the transistor, the transistor can be enabled to electrically couple between the source electrode and the drain electrode of the transistor. For example, if a voltage difference between a gate electrode and a source electrode of a transistor is less than a threshold voltage of the transistor, the transistor can be disabled to electrically decouple between the source electrode and the drain electrode of the transistor.

FIG. 1 is a block diagram of a communication system 100 including a base station 120 and client devices 110A, 110B, 110C, in accordance with some embodiments. The base station 120 and the client devices 110A, 110B, 110C may communicate through a wireless communication link. A wireless communication link may be a cellular communication link conforming to 3G, 4G, 5G, 6G, or other cellular communication protocols. In one aspect, the client devices 110A . . . 110C are located within a geographical boundary 150 with respect to the base station 120, and may communicate with or through the base station 120. In some embodiments, the communication system 100 includes more, fewer, or different number of base stations 120 and/or client devices 110 than shown in FIG. 1.

In some embodiments, the client device 110 may be a user device such as a mobile phone, a smart phone, a personal digital assistant (PDA), tablet, laptop computer, wearable computing device (e.g., head mounted display, smart watch), etc. A client device 110 may be also referred to as user equipment (UE). Each client device 110 may communicate with the base station 120 through a corresponding communication link. For example, the client device 110 may transmit or provide a wireless signal at RF to a base station 120 through a wireless communication link (e.g., 3G, 4G, 5G, 6G or other cellular communication link), and/or receive a wireless signal at RF from the base station 120 through the wireless communication link (e.g., 3G, 4G, 5G, 6G or other cellular communication link). A wireless signal may be a signal exchanged or provided through a wireless medium (e.g., air). The wireless signal may include or carry data such as audio data, image data, text, etc.

In some embodiments, the base station 120 may be a device configured to provide a wireless communication to client devices 110 within a geographical boundary 150. Examples of the base station 120 include eNB, gNB, etc. The base station 120 may be communicatively coupled to another base station 120 or other communication devices through a wireless communication link and/or a wired communication link. The base station 120 may receive a wireless signal at RF from a client device 110 or another base station 120 through a wireless communication link. Additionally or alternatively, the base station 120 may transmit or provide a wireless signal at RF to another client device 110, another base station 120, or another communication device through a wireless communication link. Hence, the base station 120 allows communication among client devices 110 associated with the base station 120, or other client devices 110 associated with different base stations 120.

Figure 2:
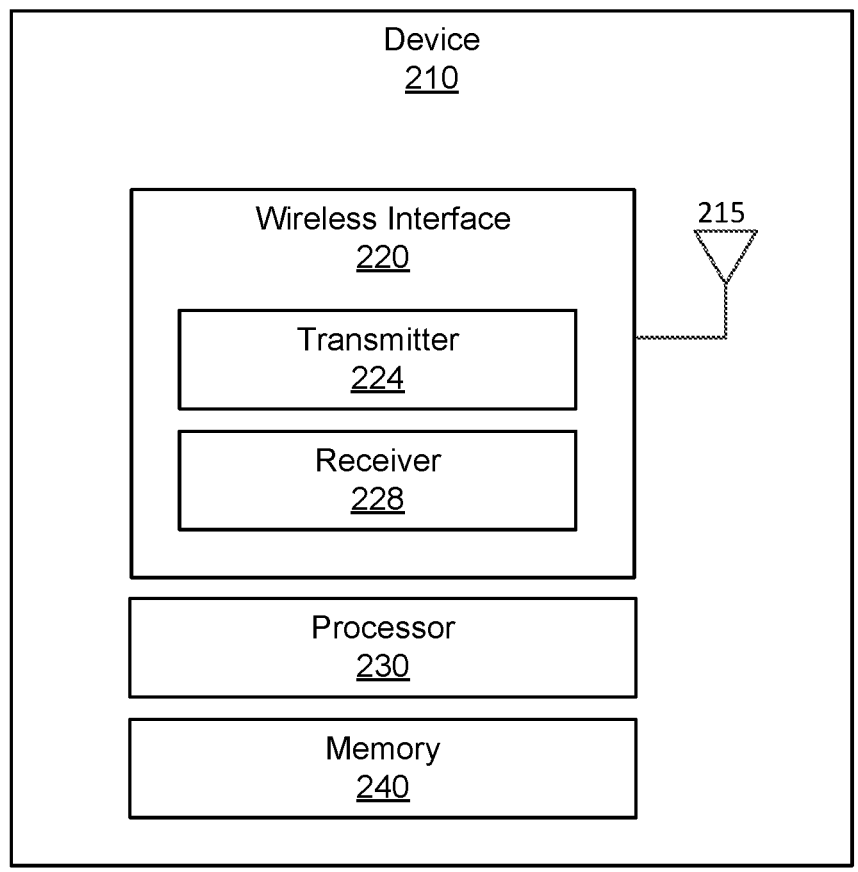
FIG. 2 is a block diagram of a device for communication through a wireless communication link, in accordance with some embodiments.

FIG. 2 is a block diagram of a device 210 for communication through a wireless communication link, in accordance with some embodiments. In some embodiments, the device 210 may be the base station 120, the client device 110, or any device that can communicate through a wireless communication link. In some embodiments, the device 210 includes an antenna 215, a wireless interface 220, a processor 230, and a memory device 240. These components may be embodied as hardware, software, firmware, or a combination thereof. In some embodiments, the device 210 includes more, fewer, or different components than shown in FIG. 2. For example, the device 210 may include an electronic display and/or an input device. For example, the device 210 may include additional antennas 215 and additional wireless interfaces 220 than shown in FIG. 2.

In some embodiments, the antenna 215 is a component that may receive a wireless signal at RF and/or transmit a wireless signal at RF through a wireless medium (e.g., air). The antenna 215 may be a dipole antenna, a patch antenna, a ring antenna, or any suitable antenna for wireless communication. In one aspect, a single antenna 215 is utilized for both transmitting a wireless signal and receiving a wireless signal. For receiving a wireless signal, the antenna 215 may detect a wireless signal having a change in an electromagnetic wave in a wireless medium (e.g., air), and provide, to the wireless interface 220, an electrical signal at RF having a voltage and/or a current corresponding to the detected change in the electromagnetic wave. An electrical signal at RF may be referred to as a RF signal herein. For transmitting a wireless signal, the antenna 215 may receive, from the wireless interface 220, an electrical signal at RF having a voltage and/or a current, and transmit, through the wireless medium (e.g., air), a wireless signal having a change in an electromagnetic wave corresponding to the electrical signal. In some embodiments, different antennas 215 can be utilized for transmitting the wireless signal and receiving the wireless signal. In some embodiments, multiple antennas 215 can be utilized to support multiple-in, multiple-out (MIMO) communication.

In some embodiments, the wireless interface 220 is a circuit or a component that may provide a RF signal to the antenna 215 or receive a RF signal from the antenna 215. In some embodiments, the wireless interface 220 includes a transmitter 224 and a receiver 228. In some embodiments, the transmitter 224 and the receiver 228 may be implemented in a same integrated circuit. In some embodiments, the transmitter 224 and the receiver 228 may be implemented in different integrated circuits. A transmitter 224 may be a circuit or a component that generates or provides a RF signal for transmitting data. In one aspect, the transmitter 224 may receive a baseband signal including or representing data (e.g., audio data, image data, text, or any data) for transmission at a baseband frequency (e.g., 0-1 GHz) from the processor 230, and upconvert the baseband signal to generate a RF signal. The transmitter 224 may provide the RF signal to an antenna 215 for transmission. A receiver 228 may be a circuit or a component that receives a RF signal for receiving data. In one aspect, the receiver 228 may receive a RF signal at the RF from an antenna 215, and downconvert the RF signal to a baseband frequency (e.g., 0-1 GHz) to obtain a downconverted signal at the baseband frequency. The downconverted signal at the baseband frequency may include or represent data (e.g., audio data, image data, text, or any data) generated by another device (e.g., another base station 120, another client device 110, etc.). The receiver 228 may provide the downconverted signal to the processor 230. In one configuration, the transmitter 224 and the receiver 228 may be coupled to the same antenna 215. In one configuration, the transmitter 224 and the receiver 228 may be coupled to different antennas 215.

The processor 230 is a component that processes data. The processor 230 may be embodied as FPGA, ASIC, a logic circuit, etc. The processor 230 may obtain instructions from the memory device 240, and execute the instructions. In one aspect, the processor 230 may receive the downconverted signal at the baseband frequency from the wireless interface 220, and decode or process data included in or represented by the downconverted signal. For example, the processor 230 may obtain audio data or image data from the downconverted signal. In one aspect, the processor 230 may generate or obtain data for transmission at the baseband frequency, and encode or process the data. For example, the processor 230 may encode or process image data or audio data at the baseband frequency, and provide a baseband signal including or representing the encoded or processed data to the wireless interface 220 for transmission.

The memory device 240 is a component that stores data. The memory device 240 may be embodied as RAM, flash memory, ROM, EPROM, EEPROM, registers, a hard disk, a removable disk, a CD-ROM, or any device capable for storing data. The memory device 240 may be embodied as a non-transitory computer readable medium storing instructions executable by the processor 230 to perform various functions of the device 210 disclosed herein. In some embodiments, the memory device 240 and the processor 230 are integrated as a single component (or an integrated circuit). In some embodiments, the memory device 240, the processor 230, and the wireless interface 220 are integrated as a single component (or an integrated circuit). In some embodiments, the memory device 240, the processor 230, and the wireless interface 220 are implemented as discrete components (or separate integrated circuits).

Figure 3:
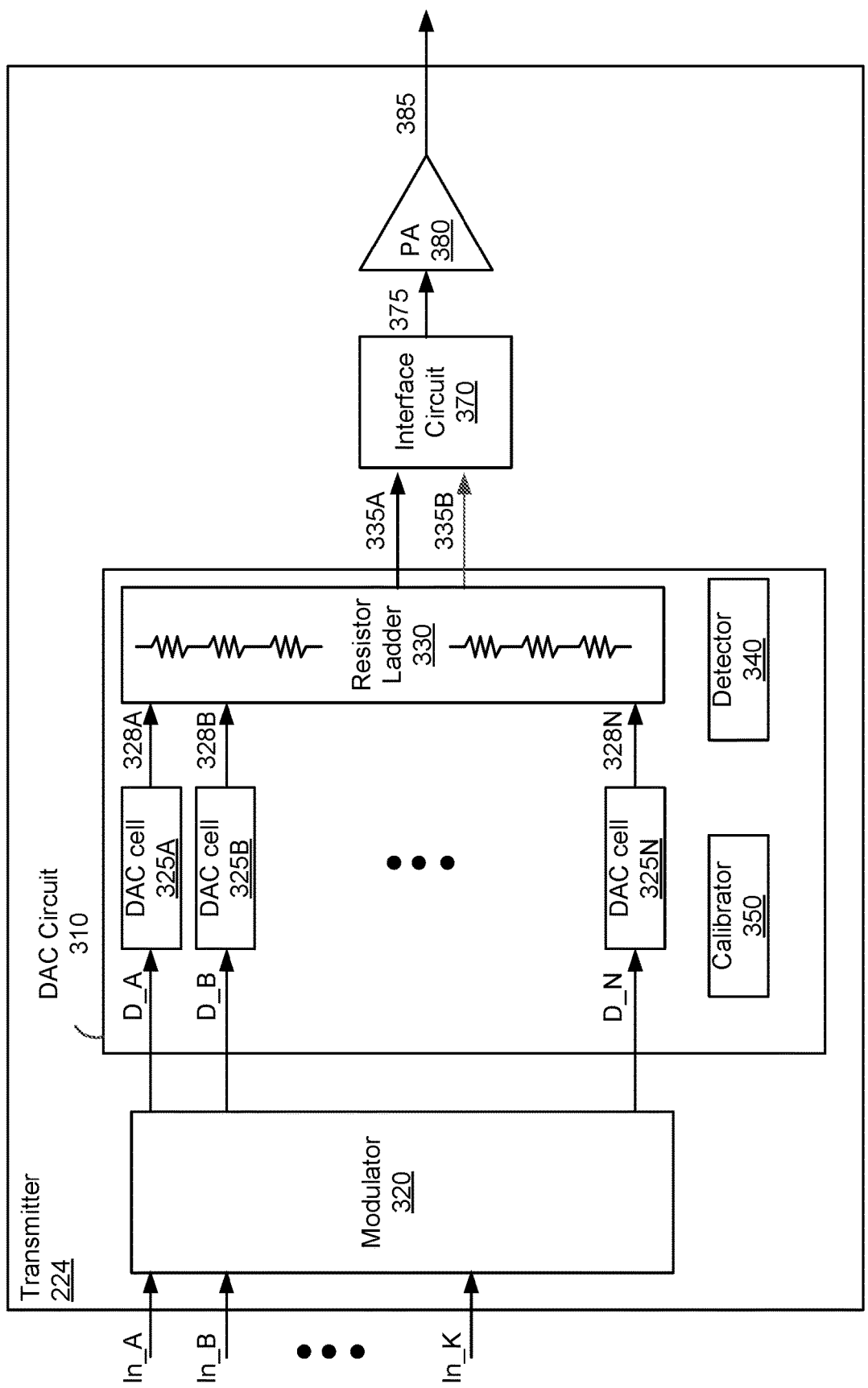
FIG. 3 is a schematic diagram of a transmitter, in accordance with some embodiments.

FIG. 3 is a schematic diagram of a transmitter 224, in accordance with some embodiments. In some embodiments, the transmitter 224 includes a DAC 310 (also referred to as "a DAC circuit 310"), a modulator 320, an interface circuit 370, and a power amplifier (PA) 380. These components may operate together to generate a RF signal 385 for transmission. In one aspect, the modulator 320 operates in a digital domain, where the interface circuit 370 and the PA 380 operate in an analog domain. The DAC circuit 310 may operate in both the analog domain and the digital domain, and may operate as an interface between the modulator 320 operating in the digital domain and the interface circuit 370 and the PA 380 operating in the analog domain. In some embodiments, the transmitter 224 includes more, fewer, or different components than shown in FIG. 3. For example, the modulator 320 may be implemented as part of the processor 230.

In some embodiments, the modulator 320 is a circuit or a component that may receive a baseband signal including K-bit data In_A . . . In_K in a digital representation, and perform modulation or upconversion on the K-bit data In_A . . . In_K. A modulation or an upconversion may be multiplying a value represented by the K-bit data In_A . . . In_K by a sine function or a cosine function of a carrier frequency at RF. A carrier frequency may be a frequency (e.g., 2~60 GHz), at which a wireless signal can be transmitted. In one approach, the modulator 320 can perform multiplication of the value represented by the K-bit data In_A . . . In_K and the sine function or the cosine function of the carrier frequency by a digital logic circuit to obtain N-bit data D_A . . . D_N representing an upconverted signal at RF. The modulator 320 may provide the N-bit data D_A . . . D_N in a digital representation to the DAC circuit 310.

In some embodiments, the DAC circuit 310 is a circuit or a component that may perform a digital-to-analog conversion. In some embodiments, the DAC circuit 310 includes a plurality of DAC cells 325A . . . 325N, a resistor ladder 330, a detector 340, and a calibrator 350. These components may operate together to receive N-bit data D_A . . . D_N in a digital representation, and provide signals 335A, 335B in an analog representation corresponding to the N-bit data D_A . . . D_N. For example, voltage amplitudes of the signals 335A, 335B may represent or correspond to a value of the N-bit data D_A . . . D_N. In some embodiments, the DAC circuit 310 includes more, fewer, or different components than shown in FIG. 3.

In some embodiments, a DAC cell 325 is a circuit or a component that may receive one bit data D, and generate a current 328 corresponding to the one bit data D. In one configuration, the DAC cell 325 includes an input port coupled to the modulator 320, and an output port coupled to a corresponding resistor of the resistor ladder 330. A port may be a pad, a metal rail, or any conductive component that can receive or provide an electrical signal (e.g., a voltage or a current). An input port may be a port to receive a signal, where an output port may be a port to provide or output a signal. In this configuration, a DAC cell 325 may receive a one bit data D, and provide a current 328 having an amplitude corresponding to the one bit data D. For example, in response to the one bit data D having a value '0', the DAC cell 325 may bypass providing a current. For example, in response to the one bit data D having a value '1', the DAC cell 325 may provide a current 328 having a certain amplitude to the resistor ladder 330. Detailed description on implementations and operations of the DAC cell 325 is provided below with respect to FIG. 4.

In some embodiments, the resistor ladder 330 is a circuit or a component that can provide voltage signals 335A, 335B corresponding to currents 328A . . . 328N from a set of DAC cells 325A . . . 325N. In one configuration, the resistor ladder 330 includes various resistors connected in a R-2R configuration. In one configuration, output ports of different DAC cells 325A can be coupled to corresponding resistors of the resistor ladder 330. In one configuration, the resistor ladder 330 includes output ports coupled to input ports of the interface circuit 370. In this configuration, the resistor ladder 330 can combine currents 328A . . . 328N from the set of DAC cells 325, and generate or provide voltage signals 335A, 335B corresponding to the combined current. The voltage signals 335A, 335B may be differential signals having opposite phases with each other. In one aspect, an amplitude of the combined current corresponds to amplitudes of the voltage signals 335A, 335B. For example, for '0001' of 4-bit input data corresponding to a value '1', a difference in amplitudes of the voltage signals 335A, 335B may be 100 mV corresponding to a current from a single DAC cell 325. For example, for '0111' of 4-bit input data corresponding to a value '3', a difference in amplitudes of the voltage signals 335A, 335B may be 300 mV corresponding to currents from three DAC cells 325. The resistor ladder 330 may provide the voltage signals 335A, 335B at its output ports.

In some embodiments, the detector 340 is a circuit or a component that may detect an error in one or more DAC cells 325. The detector 340 can be implemented as an analog circuit, a digital logic circuit, or a combination of the analog circuit and the digital logic circuit. In one configuration, the detector 340 includes one or more input ports coupled to the resistor ladder 330, and an output port coupled to an input port of the calibrator 350. In this configuration, the detector 340 can detect characteristics of one or more DAC cells 325. Examples of characteristics of a DAC cell 325 include a timing of providing a current 328, an amplitude of the current 328, etc. The detector 340 may generate one or more feedback signals indicating the detected characteristics of a DAC cell 325, and provide the one or more feedback signals to the calibrator 350.

In some embodiments, the calibrator 350 is a circuit or a component that can perform calibration of DAC cells 325. In one aspect, each DAC cell 325 may have errors due to a process corner variation, a voltage variation, a temperature variation, or a combination of them. Examples of errors may include a timing error and an amplitude error. For example, timing errors or differences in timing of providing currents 328A . . . 328N by different DAC cells 325 can cause errors in combining currents 328A . . . 328N from different DAC cells 325, and may cause inaccuracy in generating the voltage signals 335A, 335B corresponding to N-bit data. For example, if a particular DAC cell 325 provides a current 328 later than other DAC cells 325 or does not provide a current 328 at a time period allocated for providing the current 328, then the current 328 from the DAC cell 325 may not be combined properly, and may cause the amplitudes of the voltage signals 335A, 335B to represent a wrong value of a N-bit data. For example, amplitude errors or differences in amplitudes of currents 328A . . . 328N provided by different DAC cells 325A . . . 325N can cause errors in an amplitude of the combined current from different DAC cells 325A . . . 325N, and may cause inaccuracy in amplitudes of the voltage signals 335A, 335B generated based on the combined current. For example, if a particular DAC cell 325 provides a current 328 having an amplitude less than or larger than amplitudes of currents 328 from other DAC cells 325, then the amplitudes of the voltage signals 335A, 335B generated based on the combined current may represent a wrong value of a N-bit data. In one aspect, the calibrator 350 can configure or adjust each DAC cell 325 to reduce timing errors and amplitude errors.

In one aspect, the calibrator 350 may receive one or more feedback signals indicative of characteristics of one or more DAC cells 325 from the detector 340, and adjust a configuration or setting of each DAC cell 325 according to the one or more feedback signals. Examples of configuration or setting of a DAC cell 325 include a configuration to adjust a drive strength of generating or providing the current 328 and/or a configuration to adjust an amplitude of the current 328. The calibrator 350 may determine a target configuration or a target setting of each DAC cell 325, and provide a configuration signal indicating the determined configuration or setting to each DAC cell 325. For example, if the calibrator 350 determines, based on one or more feedback signals, that a particular DAC cell 325 is slower than other DAC cells 325, the calibrator 350 may generate a configuration signal causing the DAC cell 325 to increase a drive strength to provide the current 328 faster. For example, if the calibrator 350 determines, based on one or more feedback signals, that a particular DAC cell 325 provides a current 328 with an amplitude larger than amplitudes of currents 328 provided by other DAC cells 325, the calibrator 350 may generate a configuration signal causing the DAC cell 325 to provide the current 328 with a lower amplitude.

In some embodiments, the interface circuit 370 is a circuit or a component that may interface between the DAC circuit 310 and the PA 380. Examples of the interface circuit 370 include a balun, an impedance matching circuit, etc. In one configuration, the interface circuit 370 includes a first input port coupled to a first output port of the resistor ladder 330, a second input port coupled to a second output port of the resistor ladder 330, and an output port coupled to an input port of the PA 380. In this configuration, the interface circuit 370 may convert differential signals 335A, 335B into a signal 375. For example, the interface circuit 370 may obtain a difference in amplitudes of the signals 335A, 335B, and provide the difference as the signal 375. In one aspect, the interface circuit 370 may provide impedance matching between the DAC circuit 310 and the PA 380, such that the input port of the PA 380 may have a certain impedance within a range (e.g., 40~60 ohm) to ensure that the PA 380 can operate properly.

In some embodiments, the PA 380 is a circuit or a component that can amplify the signal 375 to obtain the RF signal 385 for driving the antenna 215. In some embodiments, the PA 380 includes a single amplifier circuit or two or more amplifier circuits connected in cascade. In one configuration, the PA 380 includes an input port coupled to an output port of the interface circuit 370, and an output port coupled to the antenna 215. In this configuration, the PA 380 can amplify an amplitude of the signal 375 to obtain the RF signal 385 having an amplified amplitude, and provide the RF signal 385 to the antenna 215 for transmission.

Figure 4:
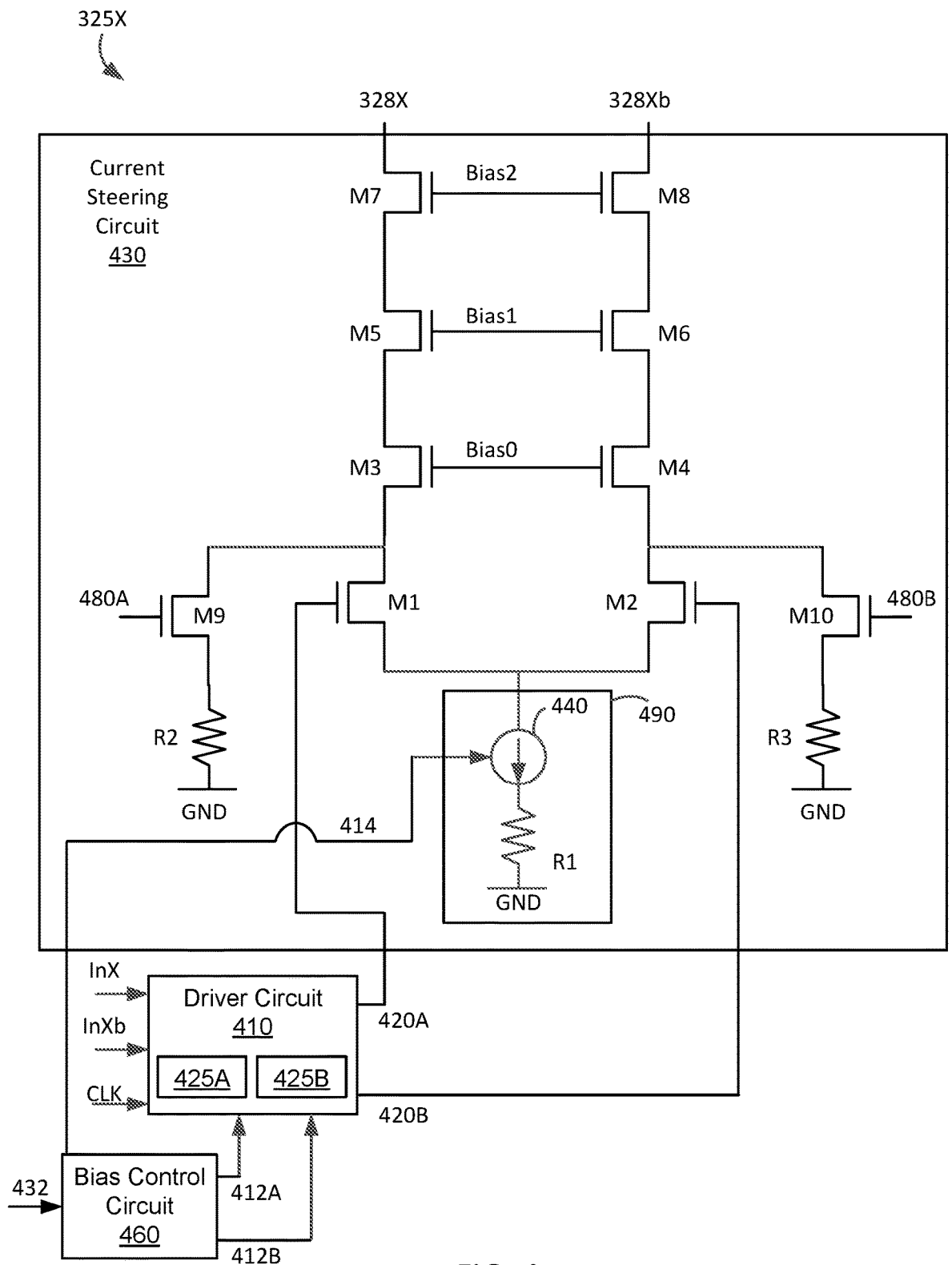
FIG. 4 is a schematic diagram of a digital-to-analog converter (DAC) cell, in accordance with some embodiments.

FIG. 4 is a schematic diagram of a DAC cell 325X, in accordance with some embodiments. The DAC cell 325X may be one of the DAC cells 325A . . . 325N. In some embodiments, the DAC cell 325X includes a current steering circuit 430, a driver circuit 410, and a bias control circuit 460. These components may operate together to provide currents 328X, 328Xb, corresponding to input signals InX, InXb. In some embodiments, the DAC cell 325X includes more, fewer, or different components than shown in FIG. 4.

In one aspect, the input signals InX, InXb may be or may correspond to one of the bits D_A . . . D_N. The input signals InX, InXb may be provided by the modulator 320. The input signals InX, InXb may be differential signals having opposite phases to represent one bit. For example, the input signal InX may have one of a first voltage (e.g., VDD or 1V) or a second voltage (e.g., GND or 0V) lower than the first voltage and the input signal InXb may have the other of the first voltage or the second voltage, according to a value of one bit to represent. For example, the input signal InX having the first voltage and the input signal InXb having the second voltage lower than the first voltage may represent a value '1' of one bit. For example, the input signal InX having the second voltage and the input signal InXb having the first voltage higher than the second voltage may represent a value '0' of one bit.

In some embodiments, the bias control circuit 460 is a circuit or a component that can provide bias voltages to the driver circuit 410 and/or the current steering circuit 430. The bias control circuit 460 may include or may be implemented as one or more logic circuits. The bias control circuit 460 may receive, from the calibrator 350, a configuration signal 432 indicating configurations or settings of the DAC cell 325X, and determine or select one or more bias voltages for the driver circuit 410 and/or the current steering circuit 430, according to the configurations or settings indicated by the configuration signal 432. The bias control circuit 460 may provide or apply one or more bias voltages 412A, 412B to the driver circuit 410 and one or more bias voltages 414 to the current steering circuit 430, according to configurations or settings indicated by the configuration signal 432. For example, for a configuration signal 432 indicating the DAC cell 325X to have a particular timing of generating currents 328X, 328Xb, the bias control circuit 460 may provide one or more bias voltages 412A, 412B to the driver circuit 410, such that the driver circuit 410 can have a particular drive strength according to the one or more bias voltages 412A, 412B to adjust the timing of generating the currents 328X, 328Xb. For example, for a configuration signal 432 indicating the DAC cell 325X to provide the currents 328X, 328Xb with a particular amplitude, the bias control circuit 460 may provide one or more bias voltages 414 to the current steering circuit 430, such that the current steering circuit 430 can set or adjust an amplitude of the currents 328X, 328Xb according to the one or more bias voltages 414. In some embodiments, the bias control circuit 460 can also generate bias voltages Bias0, Bias1, Bias2, and provide the bias voltages Bias0, Bias1, Bias2 to the current steering circuit 430. Detailed description on an example implementation of the bias control circuit 460 is provided below with respect to FIGS. 7 and 9.

In some embodiments, the driver circuit 410 is a circuit or a component that may provide signals 420A, 420B corresponding to the input signals InX, InXb to the current steering circuit 430, in response to the clock signal CLK. In some embodiments, the driver circuit 410 can include a latch or a flip flop. The driver circuit 410 may also include a level shifter or may be coupled to a level shifter. The level shifter can shift voltage levels of the signals 420A, 420B to have particular voltages amplitudes and/or a common mode voltage suitable for driving the current steering circuit 430. The signals 420A, 420B may be differential signals having opposite phases. In one aspect, the signals 420A, 420B may correspond to one bit represented by the input signals InX, InXb. For example, in response to the input signal InX having a higher voltage than the input signal InXb, the signal 420A may have a higher voltage than the signal 420B. For example, in response to the input signal InXb having a higher voltage than the input signal InX, the signal 420B may have a higher voltage than the signal 420A. In one aspect, the driver circuit 410 receives the input signals InX, InXb and provides the signals 420A, 420B, at a timing indicated by the clock signal CLK. A clock signal CLK may be a signal that toggles between two voltages periodically. In one aspect, according to a state, a voltage, or an edge of the clock signal CLK, the driver circuit 410 may receive the input signals InX, InXb and provide the signals 420A, 420B to the current steering circuit 430. For example, in response to the clock signal CLK having a first voltage (e.g., VDD or 1V), the driver circuit 410 may receive the input signals InX, InXb, and provide, to the current steering circuit 430, the signals 420A, 420B corresponding to the input signals InX, InXb. For example, in response to the clock signal CLK having a second voltage (e.g., GND or 0V), the driver circuit 410 may not provide, to the current steering circuit 430, the signals 420A, 420B corresponding to the input signals InX, InXb.

In one aspect, the driver circuit 410 can set, change or adjust a drive strength to adjust timing of providing the signals 420A, 420B. A drive strength (or a transconductance gm) may be an amount of change in a current provided, in response to a change in a voltage applied. In some embodiments, the driver circuit 410 includes a first drive control circuit 425A and a second drive control circuit 425B. The first drive control circuit 425A may be a circuit that controls or adjusts timing of edges of the signal 420A. The second drive control circuit 425B may be a circuit that controls or adjusts timing of edges of the signal 420B. In one aspect, the first drive control circuit 425A can receive one or more bias voltages 412A from the bias control circuit 460, and set or adjust a drive strength of generating the signal 420A, according to the one or more bias voltages 412A. According to the drive strength of generating the signal 420A, the driver circuit 410 can change or set timing of generating edges of the signal 420A. In one aspect, the second drive control circuit 425B can receive one or more bias voltages 412B from the bias control circuit 460, and set or adjust a drive strength of generating the signal 420B, according to the one or more bias voltages 412B. According to the drive strength of generating the signal 420B, the driver circuit 410 can change or set timing of generating edges of the signal 420B. Detailed description on an example implementation of the driver circuit 410 is provided below with respect to FIGS. 5 and 6.

In some embodiments, the current steering circuit 430 is a circuit or a component that may provide currents 328X, 328Xb indicative of one bit represented by the input signals InX, InXb. In some embodiments, the current steering circuit 430 includes transistors M1-M10, resistors R2, R3, and an adjustable current source 490. These components may operate together to receive the signals 420A, 420B, and provide the currents 328X, 328Xb, according to the signals 420A, 420B. In some embodiments, the current steering circuit 430 includes more, fewer, or different components than shown in FIG. 4.

In one aspect, currents 328X, 328Xb may correspond to one of the currents 328A . . . 328N. Currents 328X, 328Xb may be differential signals having opposite phases to indicate a value represented by the input signals InX, InXb. For example, the current 328X being larger or having a larger amplitude than the current 328Xb may correspond to one bit '1' represented by the input signals InX, InXb. For example, the current 328Xb being larger or having a larger amplitude than current 328X may correspond to one bit '0' represented by the input signals InX, InXb.

In one aspect, the adjustable current source 490 is a circuit or a component that provides a current, according to one or more bias voltages 414. In some embodiments, the adjustable current source 490 includes a resistor R1 and an adjustable transconductance circuit 440. The current provided by the adjustable current source 490 may correspond to the current 328X, the current 328Xb, or a combination of the currents 328X, 328Xb. The resistor R1 may be a component that provides a certain resistance. The adjustable transconductance circuit 440 may be a circuit or a component that provides a transconductance corresponding to one or more bias voltages 414. The adjustable transconductance circuit 440 may include or may be implemented as one or more transistors. In one configuration, the resistor R1 includes a first electrode coupled to a metal rail providing a ground voltage (e.g., GND or 0V), and a second electrode coupled to the adjustable transconductance circuit 440. In one configuration, the adjustable transconductance circuit 440 includes a first port coupled to the bias control circuit 460 to receive one or more bias voltages 414, a second port coupled to the second electrode of the resistor R1, and a third port coupled to the transistors M1, M2. In this configuration, the adjustable transconductance circuit 440 may conduct current through the resistor R1, according to the one or more bias voltages 414. For example, an amplitude of the current through the resistor R1 may be set or adjusted, according to the one or more bias voltages 414. In one aspect, the current through the resistor R1 may flow through the transistor M1, the transistor M2, or both.

In one aspect, the transistors M1, M2 may operate as a differential pair circuit to steer the current from the adjustable current source 490. The transistors M1, M2 may be MOSFETs, FinFETs, GaaFETs, or any transistors. The transistors M1, M2 may be N-type transistors. In some embodiments, the transistors M1, M2 may be implemented as P-type transistors. In one configuration, the transistor M1 includes i) a source electrode coupled to the adjustable current source 490, ii) a gate electrode coupled to the driver circuit 410 to receive the signal 420A, and iii) a drain electrode coupled to the transistor M3. In one configuration, the transistor M2 includes i) a source electrode coupled to the adjustable current source 490, ii) a gate electrode coupled to the driver circuit 410 to receive the signal 420B, and iii) a drain electrode coupled to the transistor M4. In this configuration, either the transistor M1 or the transistor M2 can be selectively enabled to steer current from the adjustable current source 490. For example, if the signal 420A has a higher voltage than the signal 420B, then the transistor M1 can conduct or provide a larger portion of the current from the adjustable current source 490 than the transistor M2. For example, if the signal 420B has a higher voltage than the signal 420A, then the transistor M2 can conduct or provide a larger portion of the current from the adjustable current source 490 than the transistor M1. The current conducted or provided by the transistor M1 may be the current 328X, and the current conducted or provided by the transistor M2 may be the current 328Xb. In one aspect, a sum of the currents 328X, 328Xb may be the current provided by the adjustable current source 490.

In one aspect, the transistors M3-M8 may operate as cascode transistors to protect the transistors M1, M2. The transistors M3-M8 may be MOSFETs, FinFETs, GaaFETs, or any transistors. The transistors M3-M8 may be N-type transistors. In some embodiments, some of the transistors M3-M8 may be implemented as P-type transistors. In some embodiments, the transistors M7, M8 may be omitted, the transistors M5-M8 may be omitted, or the transistors M3-M8 may be omitted.

In one configuration, the transistor M3 includes i) a source electrode coupled to the drain electrode of the transistor M1, ii) a gate electrode coupled to a gate electrode of the transistor M4, and iii) a drain electrode coupled to a source electrode of the transistor M5. In one configuration, the transistor M4 includes i) a source electrode coupled to the drain electrode of the transistor M2, ii) a gate electrode coupled to the gate electrode of the transistor M3, and iii) a drain electrode coupled to a source electrode of the transistor M6. Gate electrodes of the transistors M3, M4 may be coupled to the bias control circuit 460 to receive a bias voltage Bias0.

In one configuration, the transistor M5 includes i) a source electrode coupled to the drain electrode of the transistor M3, ii) a gate electrode coupled to a gate electrode of the transistor M6, and iii) a drain electrode coupled to a source electrode of the transistor M7. In one configuration, the transistor M6 includes i) a source electrode coupled to the drain electrode of the transistor M4, ii) a gate electrode coupled to the gate electrode of the transistor M5, and iii) a drain electrode coupled to a source electrode of the transistor M8. Gate electrodes of the transistors M5, M6 may be coupled to the bias control circuit 460 to receive a bias voltage Bias1.

In one configuration, the transistor M7 includes i) a source electrode coupled to the drain electrode of the transistor M5, ii) a gate electrode coupled to a gate electrode of the transistor M8, and iii) a drain electrode coupled to one or more resistors of the resistor ladder 330. In one configuration, the transistor M8 includes i) a source electrode coupled to the drain electrode of the transistor M6, ii) a gate electrode coupled to the gate electrode of the transistor M7, and iii) a drain electrode coupled to one or more resistors of the resistor ladder 330. Gate electrodes of the transistors M7, M8 may be coupled to the bias control circuit 460 to receive a bias voltage Bias2.

In this configuration, the transistors M3, M5, M7 operate as cascode transistors coupled to the transistor M1 in series. Similarly, the transistors M4, M6, M8 operate as cascode transistors coupled to the transistor M2 in series. A cascode transistor can help alleviate a voltage stress. In one example, a voltage having an amplitude larger than a tolerable stress voltage of a transistor across a source electrode and a drain electrode of the transistor can damage the transistor. By implementing one or more cascode transistors, a large voltage can be distributed among the transistors connected in series. For example, a voltage between the source electrode of the transistor M1 and the drain electrode of the transistor M7 can be shared or distributed among the transistors M1, M3, M5, M7, such that the transistor M1 can be protected. For example, a voltage between the source electrode of the transistor M2 and the drain electrode of the transistor M8 can be shared or distributed among the transistors M2, M4, M6, M8, such that the transistor M2 can be protected.

In one aspect, the transistor M9 and the resistor R2 may operate together to provide a current to ensure that the cascode transistors M3, M5, M7 operate properly, when a current from the adjustable current source 490 is provided as the current 328Xb through the transistors M2, M4, M6, M8. The current provided by the transistor M9 and the resistor R2 may be referred to as a bleeding current. The bleeding current may be 5~10% of the current provided by the adjustable current source 490. The transistor M9 may be a MOSFET, a FinFET, a GaaFET, or any transistor. The transistor M9 may be an N-type transistor. In some embodiments, the transistor M9 may be implemented as a P-type transistor. In one configuration, the resistor R2 includes a first electrode coupled to a metal rail providing a ground voltage (e.g., GND or 0V), and a second electrode coupled to a source electrode of the transistor M9. In one configuration, the transistor M9 includes i) a source electrode coupled to the second electrode of the resistor R2, ii) a gate electrode to receive a signal 480A, and iii) a drain electrode coupled to the drain electrode of the transistor M1. The signal 480A may be or correspond to the signal 420B. In this configuration, the transistor M9 can operate as a switch. For example, when the signal 420B has a higher voltage than the signal 420A, such that the current from the adjustable current source 490 flows through the transistors M2, M4, M6, M8 as the current 328Xb, the transistor M9 can be enabled to provide a lower amount of current (or bleeding current) sufficient to ensure that the transistors M3, M5, M7 operate properly. For example, when the signal 420A has a higher voltage than the signal 420B, such that the current from the adjustable current source 490 flows through the transistors M1, M3, M5, M7 as the current 328X, the transistor M9 can be disabled from providing a current (or bleeding current).

In one aspect, the transistor M10 and the resistor R3 may operate together to provide a current to ensure that the cascode transistors M4, M6, M8 operate properly, when a current from the adjustable current source 490 is provided as the current 328X through the transistors M1, M3, M5, M7. The current provided by the transistor M10 and the resistor R3 may be referred to as a bleeding current. The transistor M10 may be a MOSFET, a FinFET, a GaaFET, or any transistor. The transistor M10 may be an N-type transistor. In some embodiments, the transistor M10 may be implemented as a P-type transistor. In one configuration, the resistor R3 includes a first electrode coupled to a metal rail providing a ground voltage (e.g., GND or 0V), and a second electrode coupled to a source electrode of the transistor M10. In one configuration, the transistor M10 includes i) a source electrode coupled to the second electrode of the resistor R3, ii) a gate electrode to receive a signal 480B, and iii) a drain electrode coupled to the drain electrode of the transistor M2. The signal 480B may be or correspond to the signal 420A. In this configuration, the transistor M10 can operate as a switch. For example, when the signal 420A has a higher voltage than the signal 420B, such that the current from the adjustable current source 490 flows through the transistors M1, M3, M5, M7 as the current 328X, the transistor M10 can be enabled to provide a lower amount of current (or bleeding current) sufficient to ensure that the transistors M4, M6, M8 operate properly. For example, when the signal 420B has a higher voltage than the signal 420A, such that the current from the adjustable current source 490 flows through the transistors M2, M4, M6, M8 as the current 328Xb, the transistor M10 can be disabled from providing a current (or bleeding current).

Figure 5:
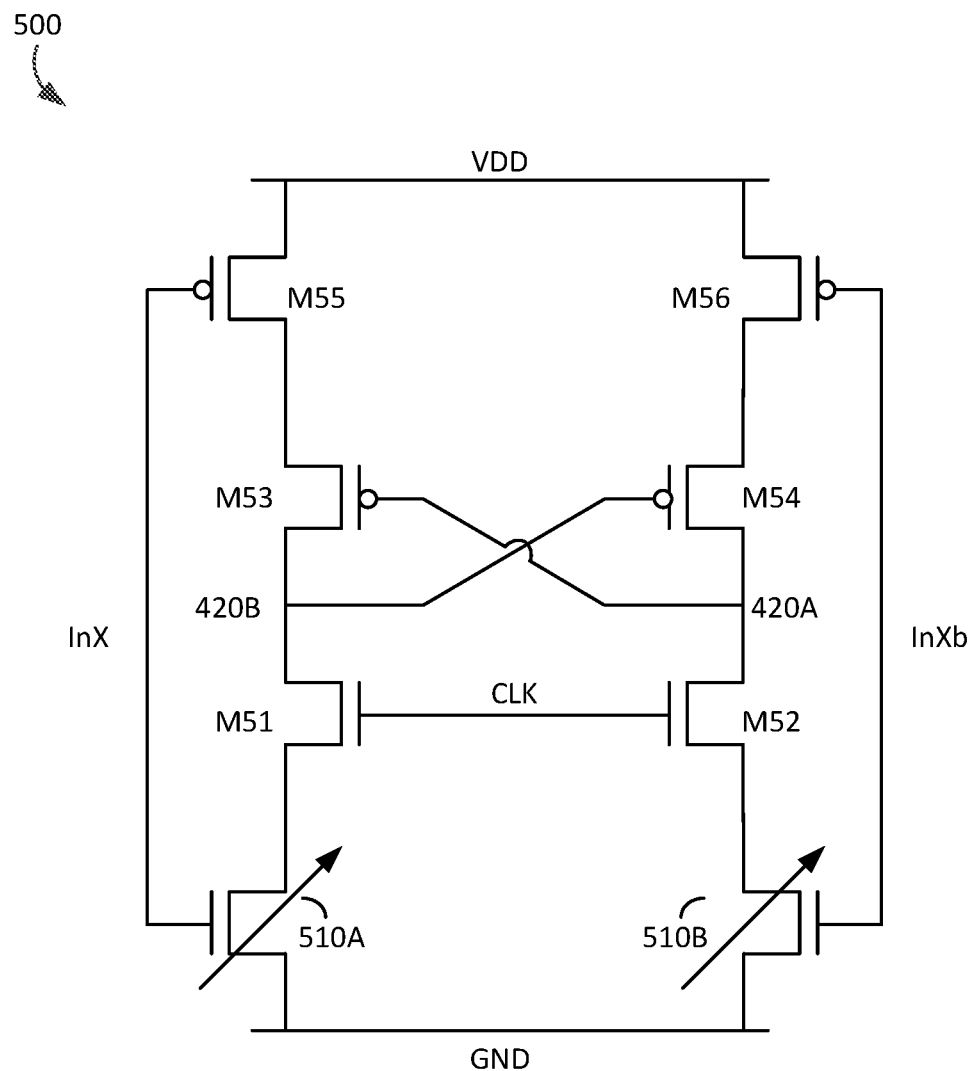
FIG. 5 is a schematic diagram of a driver circuit including adjustable transconductance circuits, in accordance with some embodiments.

FIG. 5 is a schematic diagram of a driver circuit 500 including adjustable transconductance circuits 510A, 510B, in accordance with some embodiments. The driver circuit 500 may be the driver circuit 410 of FIG. 4. In some embodiments, the driver circuit 500 includes transistors M51, M52, M53, M54, M55, M56, and the adjustable transconductance circuits 510A, 510B. In some embodiments, the adjustable transconductance circuits 510A, 510B may be the second drive control circuit 425B and the first drive control circuit 425A, respectively. These components may operate together to receive the input signals InX, InXb representing one bit and the clock signal CLK, and generate the signals 420A, 420B for driving the current steering circuit 430 at timing indicated by the clock signal CLK. In some embodiments, the transistors M51, M52, M53, M54, M55, M56 can be MOSFETs, FinFETs, GaaFETs, or any transistors. The transistors M51, M52 may be N-type transistors, and the transistors M53, M54, M55, M56 may be P-type transistors. In some embodiments, the driver circuit 500 includes more, fewer, or different components than shown in FIG. 5. For example, some of the transistors M51, M52, M53, M54, M55, M56 can be implemented as different types of transistors than shown in FIG. 5.

In one configuration, the transistor M55 includes i) a source electrode coupled to a metal rail providing a supply voltage (e.g., VDD or 1V), ii) a gate electrode to receive the input signal InX, and iii) a drain electrode coupled to a source electrode of the transistor M53. In one configuration, the transistor M53 includes i) a source electrode coupled to the drain electrode of the transistor M55, ii) a gate electrode coupled to a drain electrode of the transistor M54, and iii) a drain electrode coupled to a drain electrode of the transistor M51. In one configuration, the transistor M51 includes i) a source electrode coupled to the adjustable transconductance circuit 510A, ii) a gate electrode coupled to a gate electrode of the transistor M52 to receive a clock signal CLK, and iii) a drain electrode coupled to the drain electrode of the transistor M53. In one aspect, a voltage at the drain electrodes of the transistors M53, M51 may be a signal 420B. In one configuration, the adjustable transconductance circuit 510A is coupled between the source electrode of the transistor M51 and a metal rail providing a ground voltage (e.g., GND or 0V).

In one configuration, the transistor M56 includes i) a source electrode coupled to the metal rail providing the supply voltage (e.g., VDD or 1V), ii) a gate electrode to receive the input signal InXb, and iii) a drain electrode coupled to a source electrode of the transistor M54. In one configuration, the transistor M54 includes i) a source electrode coupled to the drain electrode of the transistor M56, ii) a gate electrode coupled to a drain electrode of the transistor M53, and iii) a drain electrode coupled to a drain electrode of the transistor M52. In one configuration, the transistor M52 includes i) a source electrode coupled to the adjustable transconductance circuit 510B, ii) a gate electrode coupled to the gate electrode of the transistor M51 to receive the clock signal CLK, and iii) a drain electrode coupled to the drain electrode of the transistor M54. In one aspect, a voltage at the drain electrodes of the transistors M54, M52 may be a signal 420A. In one configuration, the adjustable transconductance circuit 510B is coupled between the source electrode of the transistor M52 and the metal rail providing the ground voltage (e.g., GND or 0V).

In this configuration, the driver circuit 500 may operate as a latch. For example, the transistors M51, M52 may operate as switches to enable or disable current through the adjustable transconductance circuits 510A, 510B, in response to the clock signal CLK. For example, in response to the clock signal CLK having a first voltage (e.g., VDD or 1V), the transistors M51, M52 can be enabled to allow the adjustable transconductance circuits 510A, 510B to adjust or change voltages of the signals 420B, 420A, respectively. For example, in response to the clock signal CLK having a second voltage (e.g., GND or 0V), the transistors M51, M52 can be disabled to prevent the adjustable transconductance circuits 510A, 510B from adjusting or changing the voltages of the signals 420B, 420A. When the transistors M51, M52 are enabled, the adjustable transconductance circuits 510A, 510B can conduct current to decrease or pull down voltages of the signals 420B, 420A, according to the input signals InX, InXb, respectively. The transistors M55, M56 can increase or pull up voltages of the signals 420B, 420A, according to the input signals InX, InXb, respectively. The transistors M53, M54 may have a cross-coupled configuration to assist pulling up voltages of the signals 420B, 420A, respectively. In one example, when the clock signal CLK has the first voltage to enable the transistors M51, M52, if the input signal InX has a higher voltage than the input signal InXb, the adjustable transconductance circuit 510A can provide current through the transistor M51 to pull down or decrease a voltage of the signal 420B, and the transistor M56 can increase a voltage of the signal 420A. In one example, when the clock signal CLK has the first voltage to enable the transistors M51, M52, if the input signal InXb has a higher voltage than the input signal InX, the adjustable transconductance circuit 510B can provide current through the transistor M52 to pull down or decrease a voltage of the signal 420A, and the transistor M55 can increase a voltage of the signal 420B.

In one aspect, the adjustable transconductance circuits 510A, 510B are components that can set or change a drive strength, according to one or more bias voltages 412A. In some embodiments, each of the adjustable transconductance circuits 510A, 510B is implemented as two or more current sources connected in parallel. Each of the adjustable transconductance circuits 510A, 510B can set or adjust a current provided, such that a drive strength can be changed accordingly. For example, the adjustable transconductance circuits 510A, 510B may provide more current to increase a drive strength, such that the signals 420A, 420B can be generated with faster edges. For example, the adjustable transconductance circuits 510A, 510B may provide less current to decrease a drive strength, such that the signals 420A, 420B can be generated with slower edges. Detailed description on implementations and operations of the adjustable transconductance circuits 510A, 510B is provided below with respect to FIG. 6.

Figure 6:
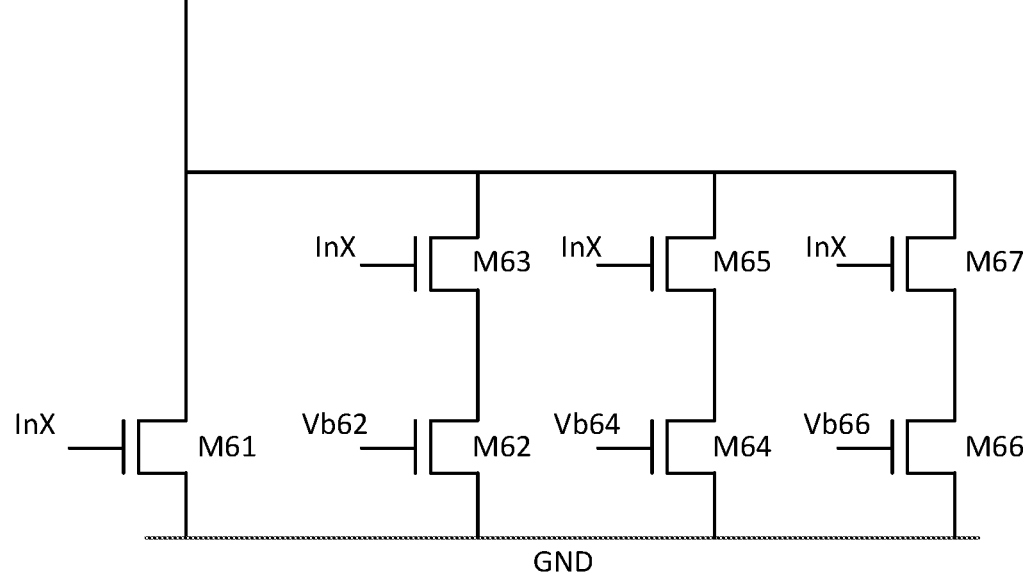
FIG. 6 is a schematic diagram of an adjustable transconductance circuit for a timing control of a DAC cell, in accordance with some embodiments.

FIG. 6 is a schematic diagram of an adjustable transconductance circuit 510A for a timing control of a DAC cell, in accordance with some embodiments. In some embodiments, the adjustable transconductance circuit 510A includes transistors M61, M62, M63, M64, M65, M66, M67. These components may operate together to receive the input signal InX representing one bit and bias voltages Vb62, Vb64, Vb66, and generate or provide a combined current 620B, according to the input signal InX and the bias voltages Vb62, Vb64, Vb66. The bias voltages Vb62, Vb64, Vb66 may be or may be part of the bias voltages 412A from the bias control circuit 460. The combined current 620B can be provided to the source electrode of the transistor M51. In some embodiments, the transistors M61, M62, M63, M64, M65, M66 can be MOSFETs, FinFETs, GaaFETs, or any transistors. The transistors M61, M62, M63, M64, M65, M66 may be N-type transistors. In some embodiments, the adjustable transconductance circuit 510A includes more, fewer, or different components than shown in FIG. 6. For example, some of the transistors M61, M62, M63, M64, M65, M66 can be implemented as different types of transistors than shown in FIG. 6. For example, the adjustable transconductance circuit 510A may include additional transistors to provide additional currents. In some embodiments, the adjustable transconductance circuit 510B has the same configuration to generate or provide a combined current to the source electrode of the transistor M52, according to the input signal InXb and corresponding bias voltages that may be the same or different from the bias voltages Vb62, Vb64, Vb66.

In one aspect, the transistor M61 operates as a transconductance circuit. In one configuration, the transistor M61 includes i) a source electrode coupled to a metal rail providing a ground voltage (e.g., GND or 0V), ii) a gate electrode to receive the input signal InX, and iii) a drain electrode coupled to the source electrode of the transistor M51. In this configuration, in response to the voltage of the input signal InX being larger than a threshold voltage of the transistor M61, the transistor M61 may be enabled to provide a current or a transconductance. In response to the voltage of the input signal InX being less than the threshold voltage of the transistor M61, the transistor M61 may be disabled and not provide a current or a transconductance.

In one aspect, the transistors M63, M62 operate as a digitally configurable transconductance circuit. In one configuration, the transistor M62 includes i) a source electrode coupled to a metal rail providing a ground voltage (e.g., GND or 0V), ii) a gate electrode to receive the bias voltage Vb62, and iii) a drain electrode coupled to a source electrode of the transistor M63. In one configuration, the transistor M63 includes i) a source electrode coupled to a drain electrode of the transistor M62, ii) a gate electrode to receive the signal InX, and iii) a drain electrode coupled to the drain electrode of the transistor M61. In this configuration, the transistor M62 may operate as a transconductance circuit. The transistor M63 may operate as a switch to enable or disable the transistor M62 from providing a current or a transconductance, according to the input signal InX. For example, in response to the voltage of the input signal InX having a first voltage (e.g., VDD or 1V), the transistor M62 can be enabled to provide a current or a transconductance corresponding to the bias voltage Vb62. In one aspect, the amount of current or transconductance provided by the transistor M62 may be adjusted or varied, according to the bias voltage Vb62. For example, in response to the voltage of the input signal InX having a second voltage (e.g., GND or 0V), the transistor M62 can be disabled from providing a current or a transconductance.

The transistors M65, M64 may be configured and operate in a similar manner as the transistors M63, M62, respectively, except the transistor M64 may provide a current or a transconductance corresponding to the bias voltage Vb64 instead of the bias voltage Vb62. Similarly, the transistors M67, M66 may be configured and operate in a similar manner as the transistors M63, M62, respectively, except the transistor M66 may provide a current or a transconductance corresponding to the bias voltage Vb66 instead of the bias voltage Vb62. Thus, detailed description of duplicated portion thereof is omitted herein for the sake of brevity.

In one aspect, currents provided by the transistors M61, M62, M64, M66 can be combined at the drain electrode of the transistor M61, and the combined current 620B can be provided to the source electrode of the transistor M51 to adjust a drive strength of the adjustable transconductance circuit 510A. The combined current 620B may correspond to or contribute to the combined transconductance for generating the signal 420B. In one aspect, each of the transistors M62, M64, M66 can be individually controlled, according to different bias voltages Vb62, Vb64, Vb66 applied, such that the combined current 620B can be set, controlled, or adjusted with a high granularity. For example, if a single transistor or a single transconductance circuit is implemented to provide the current 620B, such single transistor or the single transconductance circuit may be sensitive to a bias voltage applied, and the amount or the amplitude of the current 620B may change a lot. By implementing different transconductance circuits connected in parallel, each transconductance circuit can be individually tuned or adjusted, such that the drive strength or the combined transconductance of the adjustable transconductance circuit 510A for changing or setting timing of generating edges of the signal 420B can be adjusted with a high granularity. In some embodiments, the transistors M62, M64, M66 may have different sizes (e.g., channel widths and/or channel lengths), such that the transistors M62, M64, M66 may provide different amounts of currents or transconductances, in response to the same voltage applied. By implementing the transistors M62, M64, M66 with different sizes (e.g., channel widths and/or channel lengths), configurability or granularity of adjusting the drive strength of the adjustable transconductance circuit 510A can be improved.

Figure 7:
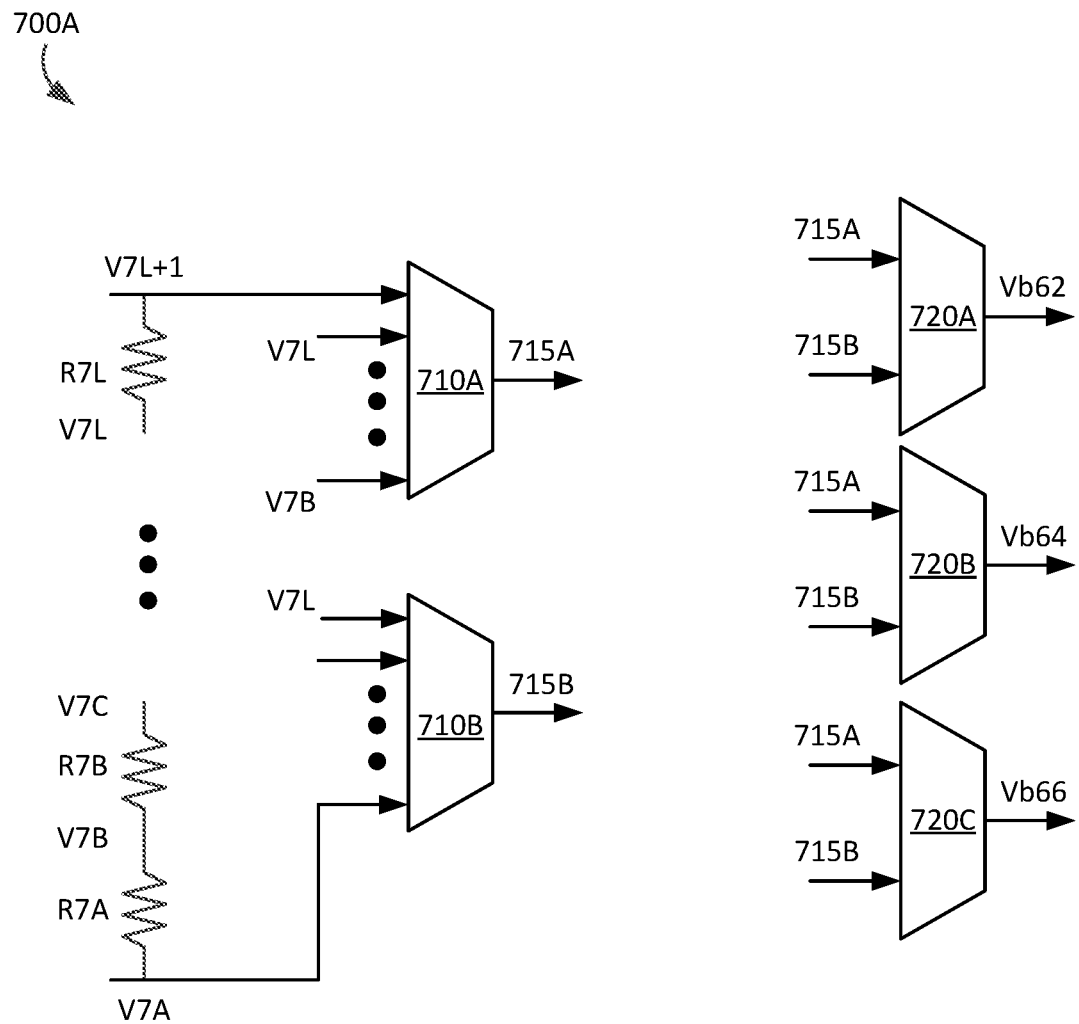
FIG. 7 is a schematic diagram of a bias control circuit configured to provide bias voltages to the adjustable transconductance circuit of FIG. 6 for the timing control of the DAC cell, in accordance with some embodiments.

FIG. 7 is a schematic diagram of a bias control circuit 700A configured to provide the bias voltages Vb62, Vb64, Vb66 to the adjustable transconductance circuit 510A for the timing control of the DAC cell 325X, in accordance with some embodiments. In some embodiments, the bias control circuit 700A is part of the bias control circuit 460. In some embodiments, the bias control circuit 700A includes a string of resistors R7A, R7B . . . R7L, L-bit multiplexers 710A, 710B, and 2-bit multiplexers 720A, 720B, 720C. These components may operate together to provide the bias voltages Vb62, Vb64, Vb66. In some embodiments, the bias control circuit 700A includes more, fewer, or different components than shown in FIG. 7. For example, the bias control circuit 700A may include additional multiplexers than shown in FIG. 7. In some embodiments, the bias control circuit 460 may also include additional multiplexers having a similar configuration as the multiplexers 710A, 710B, 720A, 720B, 720C to provide bias voltages to the adjustable transconductance circuit 510B. The bias voltages provided to the adjustable transconductance circuit 510B may be the same or different from the bias voltages Vb62, Vb64, Vb66 provided to the adjustable transconductance circuit 510A.

In some embodiments, the string of resistors R7A, R7B . . . R7L provides various voltages V7A, V7B, V7C . . . V7L, V7L+1. In one configuration, the string of resistors R7A, R7B . . . R7L includes resistors R7A, R7B . . . R7L connected in series. In this configuration, a voltage difference between the voltage V7L+1 and the voltage V7A can be distributed or divided, according to the number of resistors of the resistors R7A, R7B . . . R7L. The voltages V7L+1, V7A may be provided by a temperature compensation circuit (not shown). Assuming for an example that L is five, that the voltage V7L+1 is 0.8V and the voltage V7A is 0.3V, and that each of the resistors R7A, R7B . . . R7L has the same resistance, the string of resistors R7A, R7B . . . R7L can provide a set of voltages 0.3V, 0.4V, 0.5V, 0.6V, 0.7V, 0.8V as the voltages V7A, V7B, V7C . . . V7L, V7L+1.

In some embodiments, the L-bit multiplexer 710A is a circuit or a component that can select a voltage from a first range of voltages as a voltage 715A, and provide the selected voltage 715A. In one configuration, the L-bit multiplexer 710A receives a first subset of a set of voltages V7A, V7B, V7C . . . V7L, V7L+1, from the string of resistors R7A, R7B . . . R7L. The first subset may be voltages V7B, V7C . . . V7L, V7L+1. In one aspect, the multiplexer 710A may select one of the voltages V7B, V7C . . . V7L, V7L+1 as the voltage 715A, according to a control signal. The control signal may be a configuration signal provided by the calibrator 350.

In some embodiments, the L-bit multiplexer 710B is a circuit or a component that can select a voltage from a second range of voltages as a voltage 715B, and provide the voltage 715B. In one configuration, the L-bit multiplexer 710B receives a second subset of a set of voltages V7A, V7B, V7C . . . V7L, V7L+1, from the string of resistors R7A, R7B . . . R7L. The second subset may be voltages V7A, V7B . . . V7L. The multiplexer 710B may select one of the voltages V7A, V7B . . . V7L as the voltage 715B, according to a control signal. The control signal may be a configuration signal provided by the calibrator 350. In one aspect, the L-bit multiplexer 710B selects the voltage 715B to be lower than the voltage 715A selected by the L-bit multiplexer 710A.

In some embodiments, each of the 2-bit multiplexer 720A, 720B, 720C is a circuit or a component that can select a voltage between the voltages 715A, 715B as the bias voltage Vb62, Vb64, Vb66, respectively. In one aspect, the 2-bit multiplexer 720A, 720B, 720C may select different voltages as the bias voltages Vb62, Vb64, Vb66, respectively, according to control signals. The control signals may be configuration signals provided by the calibrator 350. In one aspect, the 2-bit multiplexer 720A, 720B, 720C can be individually controlled to select different voltages, such that varying combination of the bias voltages Vb62, Vb64, Vb66 can be provided to the adjustable transconductance circuits 510A, 510B. By providing different bias voltages Vb62, Vb64, Vb66 to the adjustable transconductance circuits 510A, 510B, the driver circuit 410 can set or adjust its drive strength with a high granularity.

Figure 8:
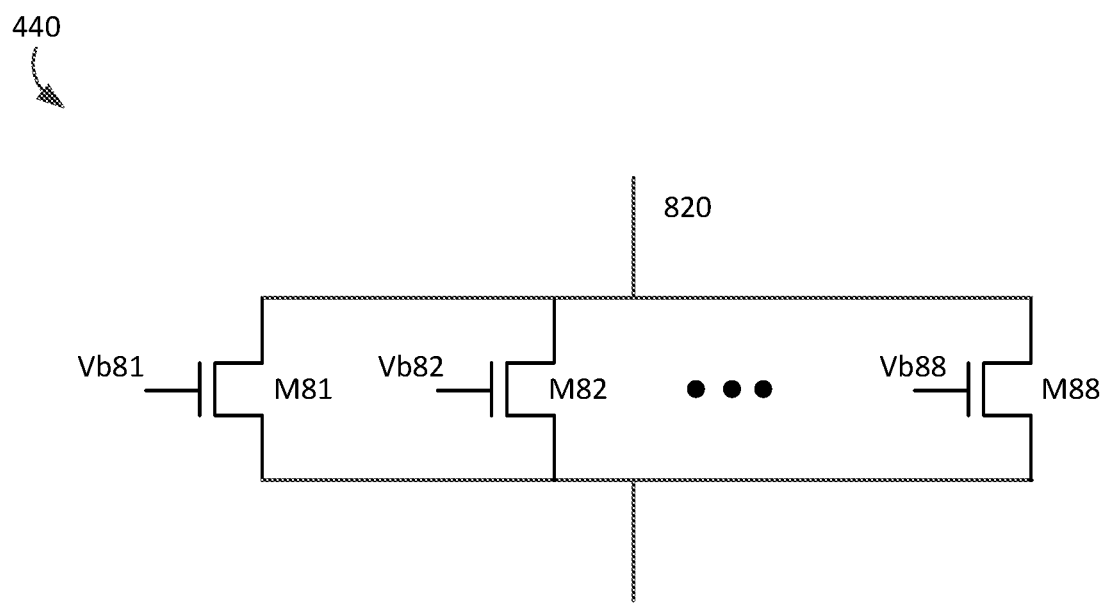
FIG. 8 is a schematic diagram of an adjustable transconductance circuit for an amplitude control of a DAC cell, in accordance with some embodiments.

FIG. 8 is a schematic diagram of an adjustable current source or adjustable transconductance circuit 440 for an amplitude control of a DAC cell 325X, in accordance with some embodiments. In some embodiments, the adjustable transconductance circuit 440 includes transistors M81, M82 . . . M88. These components may operate together to receive bias voltages Vb81, Vb82 . . . Vb88 and generate or provide a combined current 820, according to the bias voltages Vb81, Vb82 . . . Vb88. The bias voltages Vb81, Vb82 . . . Vb88 may be or may be part of the bias voltages 414 from the bias control circuit 460. In some embodiments, the transistors M81, M82 . . . M88 can be MOSFETs, FinFETs, GaaFETs, or any transistors. The transistors M81, M82 . . . M88 may be N-type transistors. In some embodiments, the adjustable transconductance circuit 440 includes more, fewer, or different components than shown in FIG. 8. For example, some of the transistors M81, M82 . . . M88 can be implemented as different types of transistors than shown in FIG. 8.

In one aspect, each of the transistors M81 . . . M88 operates as a current source. In one configuration, the transistors M81 . . . M88 may be coupled in parallel between the resistor R1 and the source electrodes of the transistors M1, M2. For example, the transistor M81 includes i) a source electrode coupled to the resistor R1, ii) a gate electrode to receive the bias voltage Vb81, and iii) a drain electrode coupled to the source electrodes of the transistors M1, M2. In this configuration, the transistor M81 can provide a current or a transconductance having an amplitude or an amount corresponding to the bias voltage Vb81. Each of the transistors M82 . . . M88 may be arranged and operate in a similar manner for a respective one of the bias voltages Vb82 . . . Vb88. Thus, detailed description of duplicated portion thereof is omitted herein for the sake of brevity.

In one aspect, currents provided by the transistors M81, M82 . . . M88 can be combined at the drain electrodes of the transistors M81, M82 . . . M88, and the combined current 820 can be provided to the source electrodes of the transistors M1, M2. In one aspect, each of the transistors M81, M82 . . . M88 can be individually controlled, according to different bias voltages Vb81, Vb82 . . . Vb88 applied, such that the combined current 820 can be set, controlled, or adjusted with a high granularity. For example, if a single transistor or a single current source is implemented to provide the current 820, such single transistor or the single current source may be sensitive to a bias voltage applied, and the amount or the amplitude of the current 820 may change a lot. By implementing different current sources or different transistors M81 . . . M88 connected in parallel, each current source or each of the transistors M81 . . . M88 can be individually tuned or adjusted, such that the current 820 can have a target amplitude or a target amount. By allowing the current 820 to be adjusted with a high granularity, the amplitude of the current 328X or the current 328Xb can be adjusted with a high granularity as well. In some embodiments, the transistors M81 . . . M88 may have different sizes (e.g., channel widths and/or channel lengths), such that the transistors M81 . . . M88 may provide different amounts of currents, in response to the same voltage applied. By implementing the transistors M81 . . . M88 with different sizes (e.g., channel widths and/or channel lengths), configurability or granularity of adjusting the amplitude of the current 820 can be improved.

Figure 9:
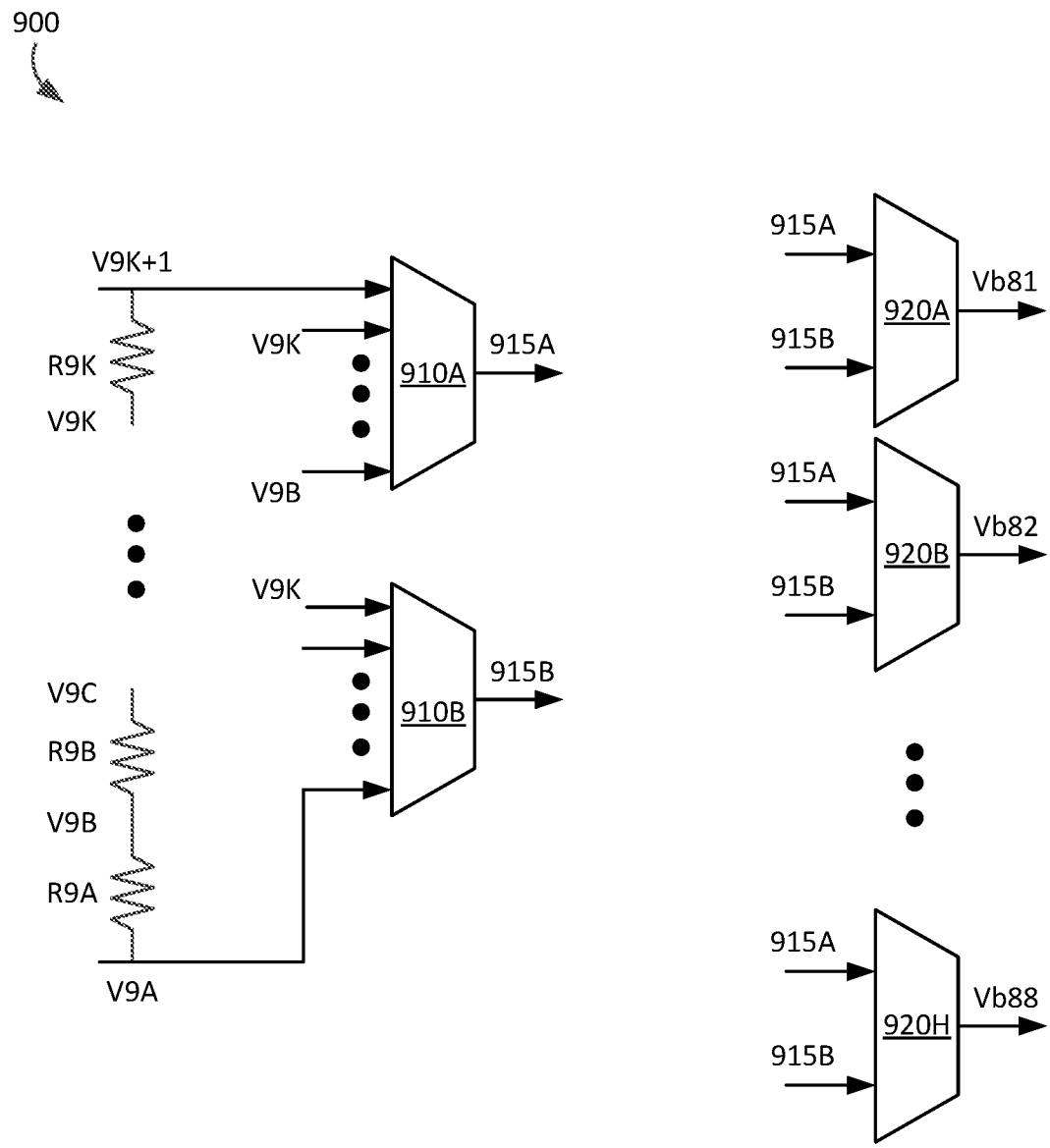
FIG. 9 is a schematic diagram of a bias control circuit configured to provide bias voltages to the adjustable transconductance circuit of FIG. 8 for the amplitude control of the DAC cell, in accordance with some embodiments.

FIG. 9 is a schematic diagram of a bias control circuit 900 configured to provide bias voltages Vb81, Vb82 . . . Vb88 to the adjustable transconductance circuit 440 of FIG. 8 for the amplitude control of the DAC cell 325X, in accordance with some embodiments. In some embodiments, the bias control circuit 900 is part of the bias control circuit 460. In some embodiments, the bias control circuit 900 has a similar configuration as the bias control circuit 700A, except that the bias control circuit 900 includes i) K number of resistors R9A, R9B . . . R9K instead of L number of resistors R7A, R7B . . . R7L, ii) K-bit multiplexers 910A, 910B instead of L-bit multiplexers 710A, 710B, and iii) 2-bit multiplexers 920A, 920B . . . 920H instead of 2-bit multiplexers 720A, 720B, 720C. Thus, detailed description of duplicated portion thereof is omitted herein for the sake of brevity. These components may operate together to provide the bias voltages Vb81, Vb82 . . . Vb88. By providing different bias voltages Vb81, Vb82 . . . Vb88 to the adjustable transconductance circuit 440, the amplitude of the current 328X or the current 328Xb can be adjusted with a high granularity, such that the amplitude errors can reduced or removed. In some embodiments, the bias control circuit 900 includes more, fewer, or different components than shown in FIG. 9.

Figure 10:
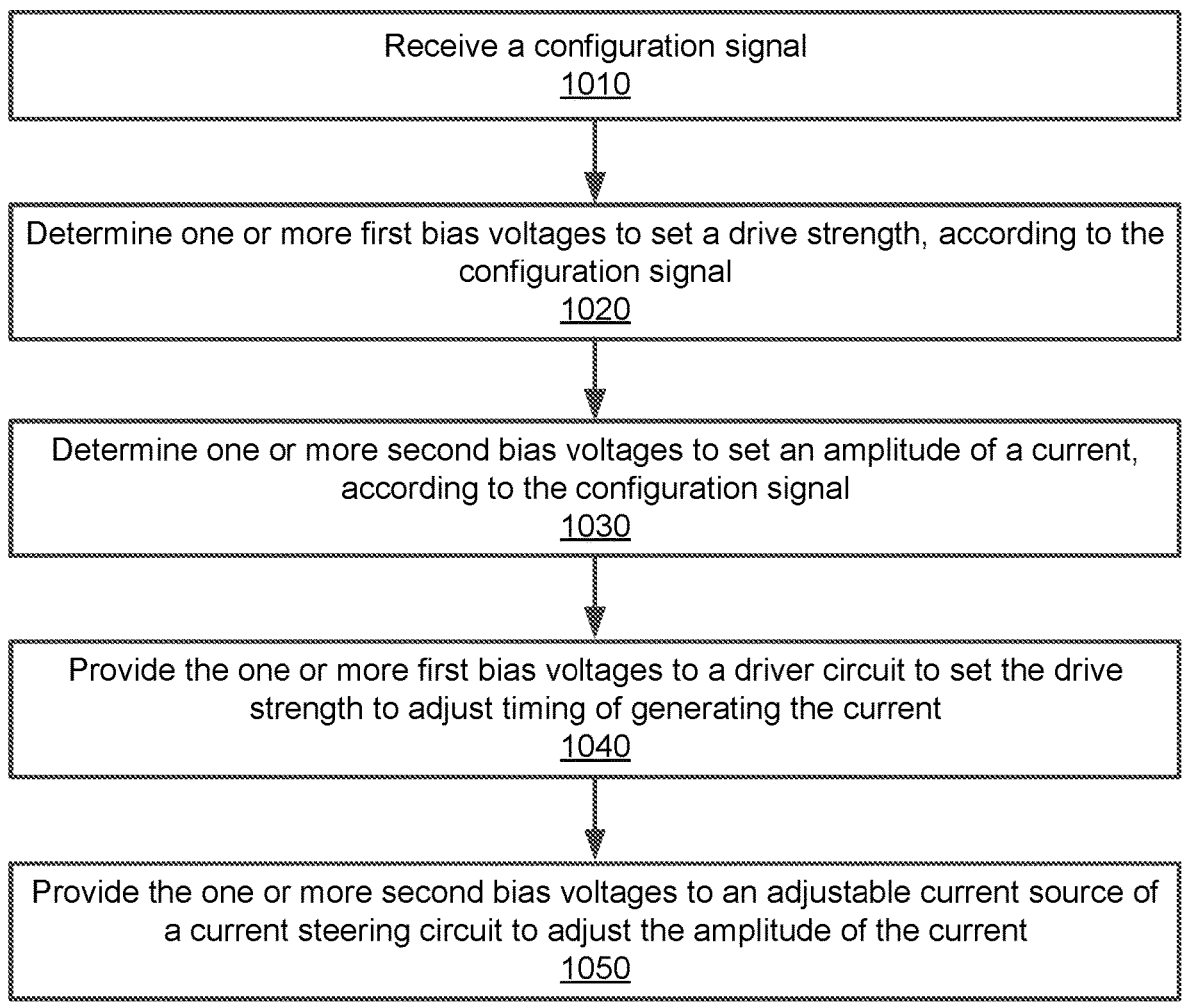
FIG. 10 is a flow chart showing operations of calibrating a DAC cell, in accordance with some embodiments.

FIG. 10 is a flow chart showing operations 1000 of calibrating a DAC cell 325X, in accordance with some embodiments. In some embodiments, the operations 1000 are performed by the bias control circuit 460. In some embodiments, the operations 1000 are performed by a different entity (e.g., calibrator 350). In some embodiments, the operations 1000 include more, fewer, or different steps than shown in FIG. 10. In some embodiments, the operations 1000 are performed in a different order than shown in FIG. 10. For example, operations 1030 and 1050 can be performed before operation 1020.

In one approach, the bias control circuit 460 receives 1010 a configuration signal 432. The configuration signal 432 may be a signal indicating configuration or setting to a DAC cell 325X. For example, a configuration signal 432 may indicate or correspond to configuring multiplexers 710A, 710B, 720A, 720B, 720C of the bias control circuit 700A. For example, a configuration signal 432 may indicate or correspond to configuring multiplexers 910A, 910B, 920A . . . 920H of the bias control circuit 900.

In one approach, the bias control circuit 460 determines 1020 one or more first bias voltages to set a drive strength, according to the configuration signal 432. The one or more first bias voltages may include voltages (e.g., Vb62, Vb64, Vb66) to provide to the adjustable transconductance circuit 510A and/or the adjustable transconductance circuit 510B. For example, the multiplexers 710A, 710B, 720A, 720B, 720C can be configured, according to the configuration signal 432, to select, from a plurality of ranges of voltages V7A, V7B . . . V7L+1, bias voltages Vb62, Vb64, Vb66 to provide to the adjustable transconductance circuit 510A of the driver circuit 410.

In one approach, the bias control circuit 460 determines 1030 one or more second bias voltages (e.g., Vb81, Vb82 . . . Vb88) to set an amplitude of a current (e.g., currents 328X, 328Xb), according to the configuration signal 432. For example, the multiplexers 910A, 910B, 920A, 920B . . . 920H can be configured, according to the configuration signal 432, to select, from a plurality of ranges of voltages V9A, V9B . . . V9K+1, bias voltages Vb82, Vb82 . . . Vb88 to provide to the adjustable current source 490 of the current steering circuit 430.

In one approach, the bias control circuit 460 provides 1040 the one or more first bias voltages (e.g., Vb62, Vb64, Vb66) to the driver circuit 410. According to the one or more first bias voltage (e.g., Vb62, Vb64, Vb66), the driver circuit 410 may have a corresponding drive strength to adjust timing of generating the current (e.g., currents 328X, 328Xb). In one aspect, the driver circuit 410 may generate a signal (e.g., signals 420A, 420B) having an edge, where the edge or the timing of generating the signal (e.g., signals 420A, 420B) can be controlled or adjusted, according to the drive strength of the driver circuit 410. For example, by increasing the drive strength, the signal (e.g., signals 420A, 420B) may have a faster edge. For example, by decreasing the drive strength, the signal (e.g., signals 420A, 420B) may have a slower edge. In one aspect, the edge of the signal (e.g., signals 420A, 420B) corresponds to timing of generating the current (e.g., currents 328X, 328Xb). For example, by providing the signal (e.g., signals 420A, 420B) with a faster edge, the current steering circuit 430 can generate an edge of the current (e.g., currents 328X, 328Xb) faster. For example, by providing the signal (e.g., signals 420A, 420B) with a slower edge, the current steering circuit 430 can delay generating an edge of the current (e.g., currents 328X, 328Xb). Hence, by adjusting the drive strength of the driver circuit 410, timing of generating the current (e.g., currents 328X, 328Xb) can be adjusted. By adjusting timing of generating the current (e.g., currents 328X, 328Xb) for each DAC cell 325, the accuracy of the digital-to-analog conversion by the DAC circuit 310 can be improved.

In one approach, the bias control circuit 460 provides 1050 the one or more second bias voltages (e.g., Vb81, Vb82 . . . Vb88) to the adjustable current source 490 of the current steering circuit 430. According to the one or more second bias voltages (e.g., Vb81, Vb82 . . . Vb88), the adjustable current source 490 may provide the current (e.g., currents 328X, 328Xb) with a corresponding amplitude. By adjusting the amplitudes of the current (e.g., currents 328X, 328Xb) for each DAC cell 325, the accuracy of the digital-to-analog conversion by the DAC circuit 310 can be improved.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a digital to analog conversion cell comprising:
   a first circuit configured to generate a first signal, the first circuit being a bias circuit;
   a second circuit coupled to the first circuit, the second circuit configured to generate a second signal, based on the first signal and an input bit, the second signal having a first edge positioned in response to the first signal, the second circuit being a driver circuit; and
   a third circuit coupled to the second circuit, the third circuit configured to generate a third signal having a second edge, in response to the first edge of the second signal, an amplitude of the third signal corresponding to the input bit, the third circuit being current steering circuit, wherein the second circuit includes a fourth circuit configured to provide a first drive strength of the second circuit, according to the first signal, the second circuit configured to generate the first edge of the second signal according to the first drive strength.

2. The device of claim 1,
   wherein the first circuit is configured to generate a fourth signal,
   wherein the second circuit includes a fifth circuit configured to provide a second drive strength of the second circuit, according to the fourth signal, the second circuit configured to generate a third edge of the second signal according to the second drive strength, the third edge subsequent to the first edge of the second signal, and
   wherein the third circuit is configured to generate a fourth edge of the third signal, in response to the third edge of the second signal, the fourth edge subsequent to the second edge of the third signal.

3. The device of claim 1, wherein the fourth circuit comprises:
   a first transistor configured to provide a second drive strength, and
   a second transistor configured to provide a third drive strength, the fourth circuit configured to provide the first drive strength, based on the second drive strength and the third drive strength.

4. The device of claim 3, wherein the fourth circuit includes:
   a third transistor coupled to the first transistor in series, the third transistor configured to enable or disable the first transistor, according to the input bit, and
   a fourth transistor coupled to the second transistor in series, the fourth transistor configured to enable or disable the second transistor, according to the input bit.

5. The device of claim 4, wherein the first signal comprises:
   a first voltage applied to a first gate electrode of the first transistor, the first voltage corresponding to the second drive strength, and
   a second voltage applied to a second gate electrode of the second transistor, the second voltage corresponding to the third drive strength.

6. The device of claim 5, wherein the first circuit comprises:
   a first multiplexer configured to select, from a first set of voltages, a third voltage,
   a second multiplexer configured to select, from a second set of voltages, a fourth voltage,
   a third multiplexer configured to select one of the third voltage or the fourth voltage, as the first voltage, and
   a fourth multiplexer configured to select one of the third voltage or the fourth voltage, as the second voltage.

7. The device of claim 3,
   wherein the first circuit is configured to provide a fourth signal to the third circuit, and
   wherein the third circuit is configured to set the amplitude of the third signal, according to the fourth signal.

8. The device of claim 7, wherein the third circuit includes a fifth circuit configured to set a first current of the third circuit, according to the fourth signal, and set the amplitude of the third signal according to the first current.

9. The device of claim 8, wherein the fifth circuit comprises:
   a third transistor configured to provide a second current, and
   a fourth transistor configured to provide a third current, the fifth circuit configured to provide the first current, based on the second current and the third current.

10. The device of claim 9, wherein the fourth signal comprises:
    a first voltage applied to a first gate electrode of the third transistor, the third transistor configured to provide the second current, according to the first voltage at the first gate electrode of the third transistor, and
    a second voltage applied to a second gate electrode of the fourth transistor, the fourth transistor configured to provide the third current, according to the second voltage at the second gate electrode of the fourth transistor.

11. The device of claim 10, wherein the first circuit comprises:
    a first multiplexer configured to select, from a first set of voltages, a third voltage,
    a second multiplexer configured to select, from a second set of voltages, a fourth voltage,
    a third multiplexer configured to select one of the third voltage or the fourth voltage, as the first voltage, and
    a fourth multiplexer configured to select one of the third voltage or the fourth voltage, as the second voltage.

12. The device of claim 11,
    wherein the first signal comprises:
    a fifth voltage applied to a third gate electrode of the first transistor, the fifth voltage corresponding to the second drive strength, and a sixth voltage applied to a fourth gate electrode of the second transistor, the sixth voltage corresponding to the third drive strength, and wherein the first circuit includes:

a fifth multiplexer configured to select, from a third set of voltages, a seventh voltage, a sixth multiplexer configured to select, from a fourth set of voltages, an eighth voltage, a seventh multiplexer configured to select one of the seventh voltage or the eighth voltage, as the fifth voltage, and an eighth multiplexer configured to select one of the seventh voltage or the eighth voltage, as the sixth voltage.

13. A digital to analog converter cell device comprising:

a second circuit coupled to a first circuit configured to provide a first signal, the second circuit configured to generate a second signal, based on the first signal, the second signal indicating a timing of a third signal, the third signal being a current representative of a bit input for the device, wherein a drive strength of the second circuit is affected by the first signal; and a third circuit coupled to the second circuit, the third circuit configured to generate the third signal, according to the timing indicated by the second signal, an amplitude of the third signal corresponding to the bit input, the amplitude of the third signal being a level of current.

14. The device of claim 13, wherein the second circuit comprises a fourth circuit configured to provide a first drive strength of the second circuit, according to the first signal, the second circuit configured to generate a first edge of the second signal according to the first drive strength, the first edge indicating the timing of a second edge of the third signal.

15. The device of claim 14, wherein the fourth circuit comprises:

a first transistor configured to provide a second drive strength, and a second transistor configured to provide a third drive strength, the fourth circuit configured to provide the first drive strength, according to the second drive strength and the third drive strength.

16. The device of claim 15, wherein the fourth circuit comprises:

a third transistor coupled to the first transistor in series, the third transistor configured to enable or disable the first transistor, according to the bit input, and a fourth transistor coupled to the second transistor in series, the fourth transistor configured to enable or disable the second transistor, according to the bit input.

17. A device comprising:

a digital to analog converter cell comprising:

a first bias circuit configured to generate a first signal and a second signal;

a driver circuit coupled to the first bias circuit, the driver circuit configured to generate a third signal, based on the first signal, the third signal having a first edge according to the first signal; and a current circuit coupled to the driver circuit, the current circuit configured to generate a fourth signal having a second edge and an amplitude, according to the second signal and the third signal, the second edge of the fourth signal corresponding to the first edge of the third signal, the amplitude of the fourth signal is related to the second signal.

18. The device of claim 17, wherein the driver circuit includes a fourth circuit configured to provide a first drive strength of the driver circuit, according to the first signal, the driver circuit configured to generate the first edge of the second signal according to the first drive strength.

19. The device of claim 17, wherein the device is a transmitter.

20. The device of claim 19, wherein the transmitter includes a digital-to-analog converter, wherein the digital-to-analog converter includes the first bias circuit, the driver circuit, and the current circuit, wherein the amplitude is a magnitude of current of the third signal.

* * * * *